United States Patent
Isobata et al.

(10) Patent No.: US 12,402,291 B2
(45) Date of Patent: Aug. 26, 2025

(54) COMPONENT SUPPLY DEVICE

(71) Applicant: Panasonic Intellectual Property Management Co., Ltd., Osaka (JP)

(72) Inventors: Yoshinori Isobata, Fukuoka (JP); Atuyuki Horie, Fukuoka (JP); Minoru Kitani, Fukuoka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 408 days.

(21) Appl. No.: 18/054,180

(22) Filed: Nov. 10, 2022

(65) Prior Publication Data
US 2023/0156993 A1    May 18, 2023

(30) Foreign Application Priority Data
Nov. 17, 2021    (JP) .................................. 2021-186735

(51) Int. Cl.
*H05K 13/04*    (2006.01)
*H05K 13/02*    (2006.01)

(52) U.S. Cl.
CPC ....... *H05K 13/0419* (2018.08); *H05K 13/021* (2013.01); *H05K 2203/0264* (2013.01)

(58) Field of Classification Search
CPC ... H05K 13/0419; H05K 13/02; H05K 13/021
USPC ........................................................ 156/750
See application file for complete search history.

(56) References Cited

U.S. PATENT DOCUMENTS

2017/0251578 A1 *    8/2017    Takata ............... H05K 13/0419

FOREIGN PATENT DOCUMENTS

JP    2021-125625    8/2021

* cited by examiner

*Primary Examiner* — James D Sells
(74) *Attorney, Agent, or Firm* — McDonald Hopkins LLC

(57) ABSTRACT

A component supply device includes an introduction sprocket that rotates with an outer peripheral pin engaged with a feed hole of a carrier tape on a conveyance path, thereby conveying the carrier tape, and a wheel that has a plurality of recesses on an outer periphery, and receives the outer peripheral pin of the rotating introduction sprocket by the recess to rotate in accordance with rotation of the introduction sprocket. A contact surface of the outer peripheral pin contacting an inner surface of the recess and a contacted surface with which the outer peripheral pin contacts out of the inner surface of the recess are both formed of flat surfaces, and the contact surface and the contacted surface come into line contact with each other.

10 Claims, 19 Drawing Sheets

ENLARGED VIEW OF REGION AE1

ENLARGED VIEW OF REGION AE2

ENLARGED VIEW OF REGION AE3

CROSS-SECTIONAL VIEW TAKEN ALONG V-V

COMPONENT SUPPLY DEVICE

BACKGROUND

1. Technical Field

The present disclosure relates to a component supply device that conveys a component supply tape storing a component and supplies the component to a component supply position.

2. Description of the Related Art

Conventionally, a component mounting device that mounts a component on a substrate is known. As a component supply device that supplies a component to a component mounting device, often used is a tape feeder using a carrier tape (component supply tape) formed by sticking a cover tape to a base tape that stores a component. A tape feeder includes, on a frame having a conveyance path for a carrier tape, a sprocket that conveys the carrier tape on the conveyance path, and a peeling part that peels off a cover tape from a base tape of the carrier tape conveyed by the sprocket.

Among such component supply devices, from a viewpoint of reduction in the number of components, and the like, there is known, as a configuration for driving a certain gear, a configuration in which the target gear is driven using a sprocket for conveying a carrier tape instead of a gear (e.g., PTL 1 below). In this case, a disk-shaped member is provided concentrically with the target gear to be driven, and a pin of a rotating sprocket is brought into contact with a recess provided in an outer peripheral portion of the disk-shaped member to transmit rotation of the sprocket to the target gear.

CITATION LIST

Patent Literature

PTL 1: Unexamined Japanese Patent Publication No. 2021-125625

SUMMARY

However, since a pin of a sprocket conventionally has a conical shape due to processability and ease of releasing of a carrier tape from a feed hole, when the pin of the sprocket contacts a recess of a disk-shaped member, the pin comes into point contact with an inner surface of the recess (i.e., locally abuts) to cause wear, which might cause deterioration in durability of the pin.

Therefore, an object of the present disclosure is to provide a component supply device enabling reduction in wear of a pin of a sprocket that transmits rotation to a wheel.

A component supply device of the present disclosure is a component supply device that supplies a component to a component supply position using a component supply tape including a base tape and a cover tape, the base tape having a storage part storing the component, and the cover tape being attached to the base tape to cover the storage part, the component supply device including: a frame including a conveyance path for the component supply tape; a sprocket that is provided in the frame, includes a pin, and rotates with the pin engaged with a feed hole of the component supply tape on the conveyance path to convey the component supply tape; and a disk-shaped member that rotates in accordance with rotation of the sprocket when the pin of the rotating sprocket comes into contact with a recess provided on an outer periphery of the disk-shaped member.

According to the present disclosure, it is possible to reduce wear of a pin of a sprocket that transmits rotation to a wheel.

Figure 9:
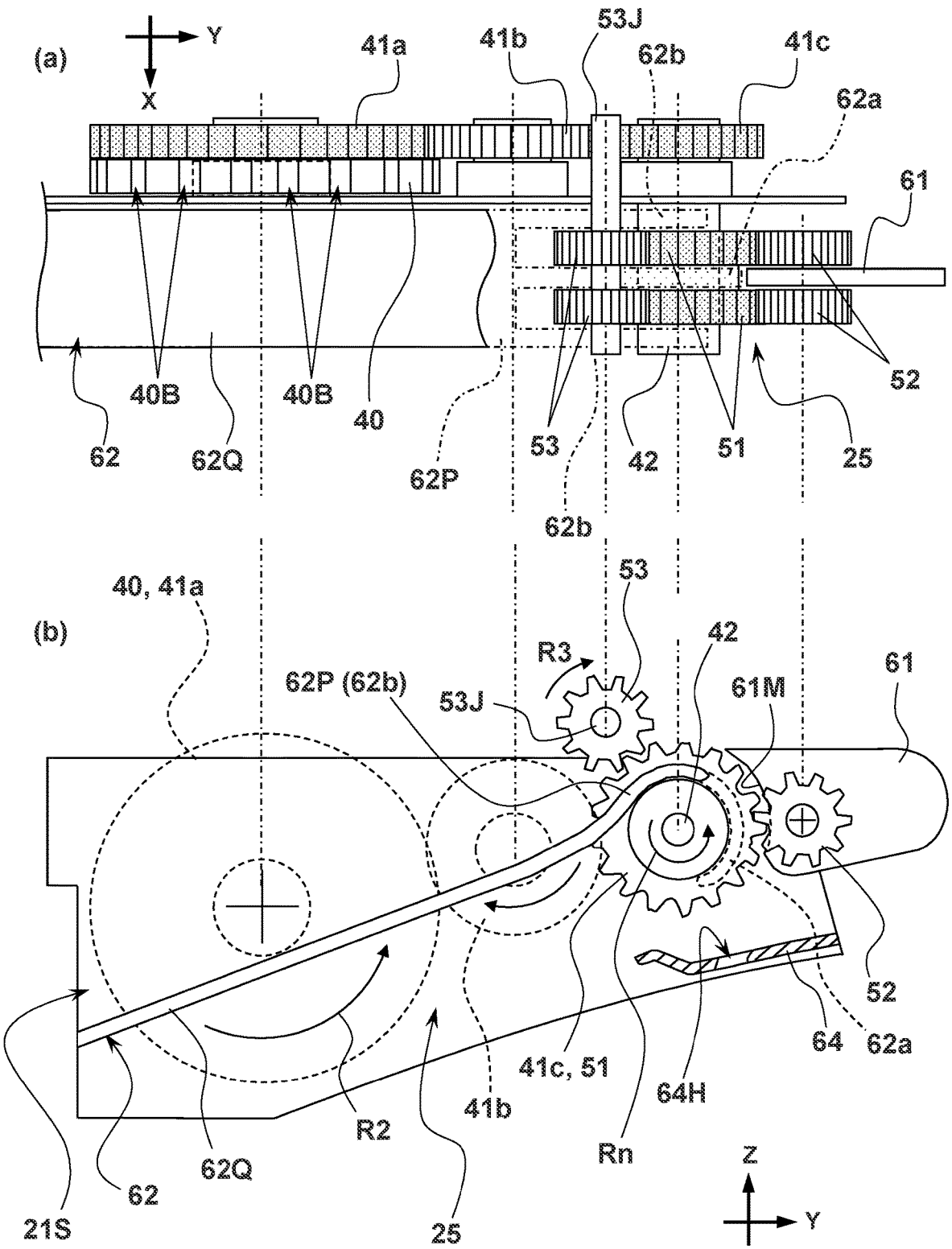
Figure 10A:
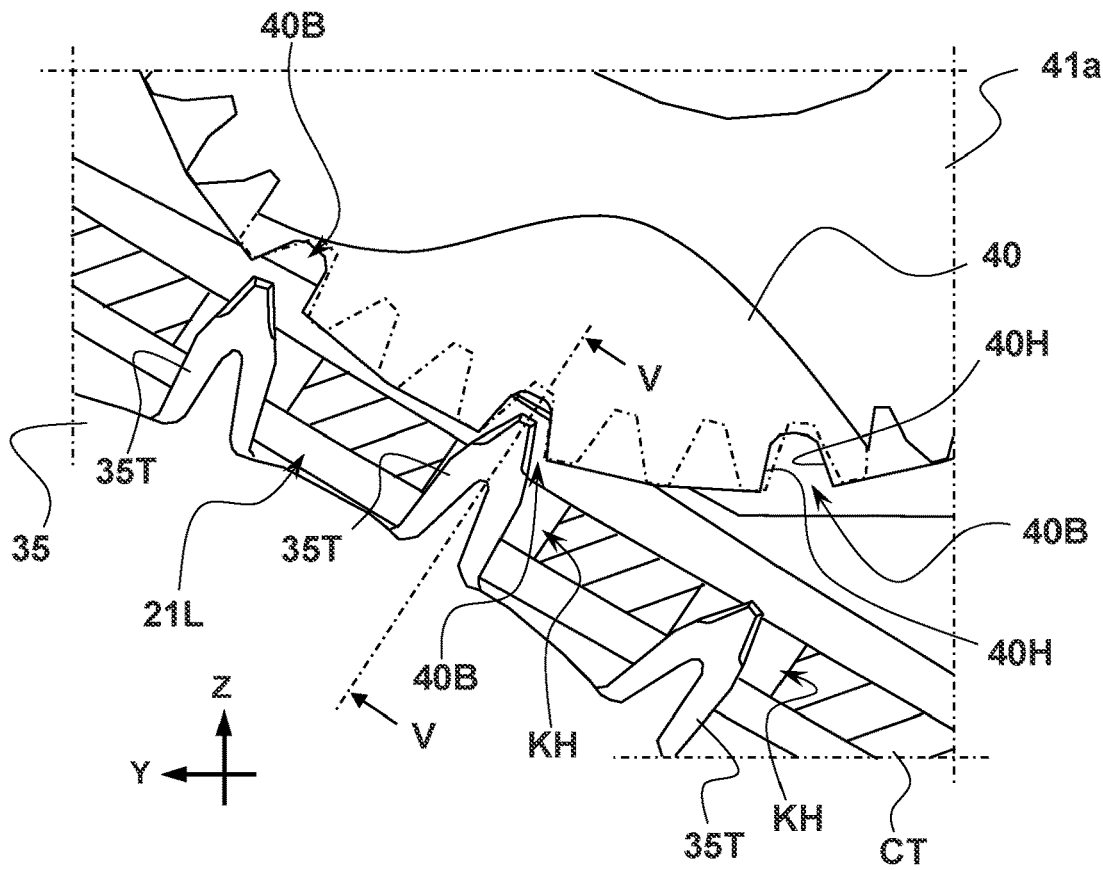
Figure 10B:
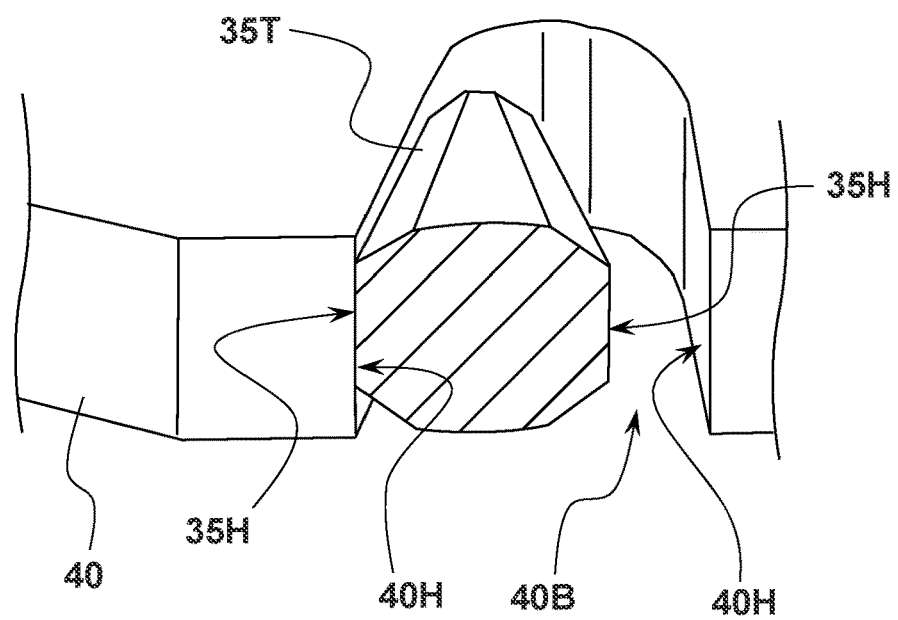
Figure 11:
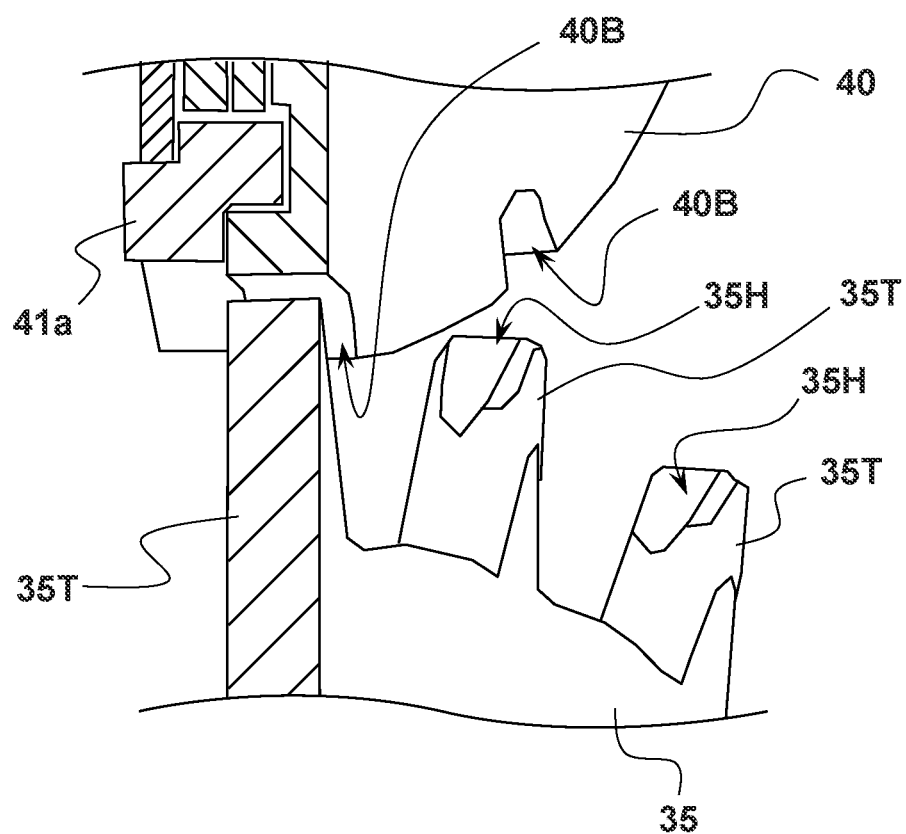
Figure 12A:
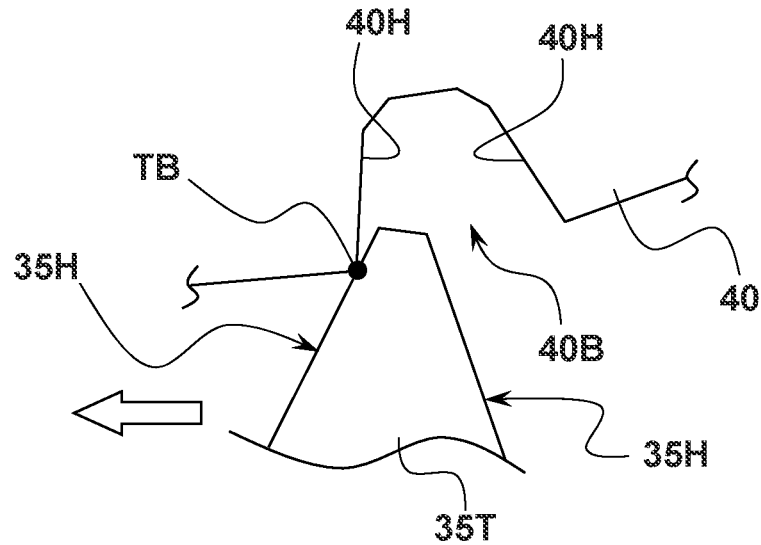
Figure 12B:
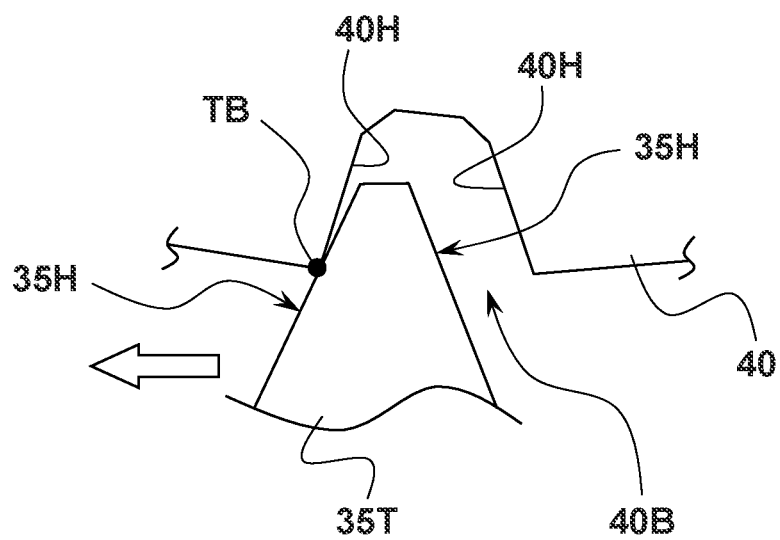
Figure 12C:
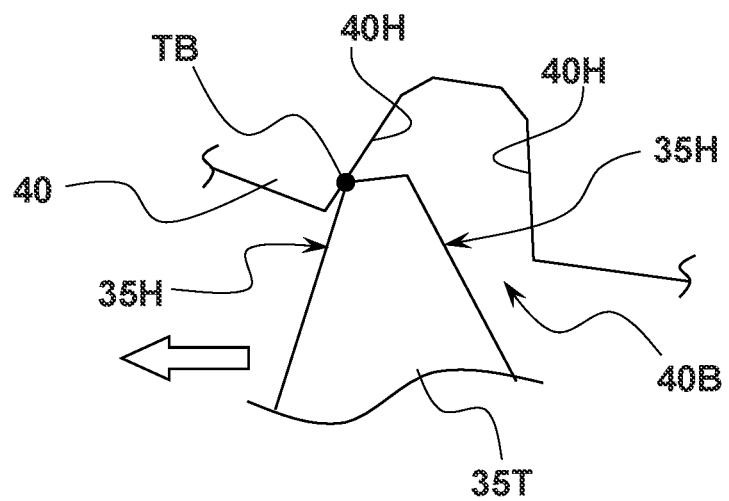
Figure 13:
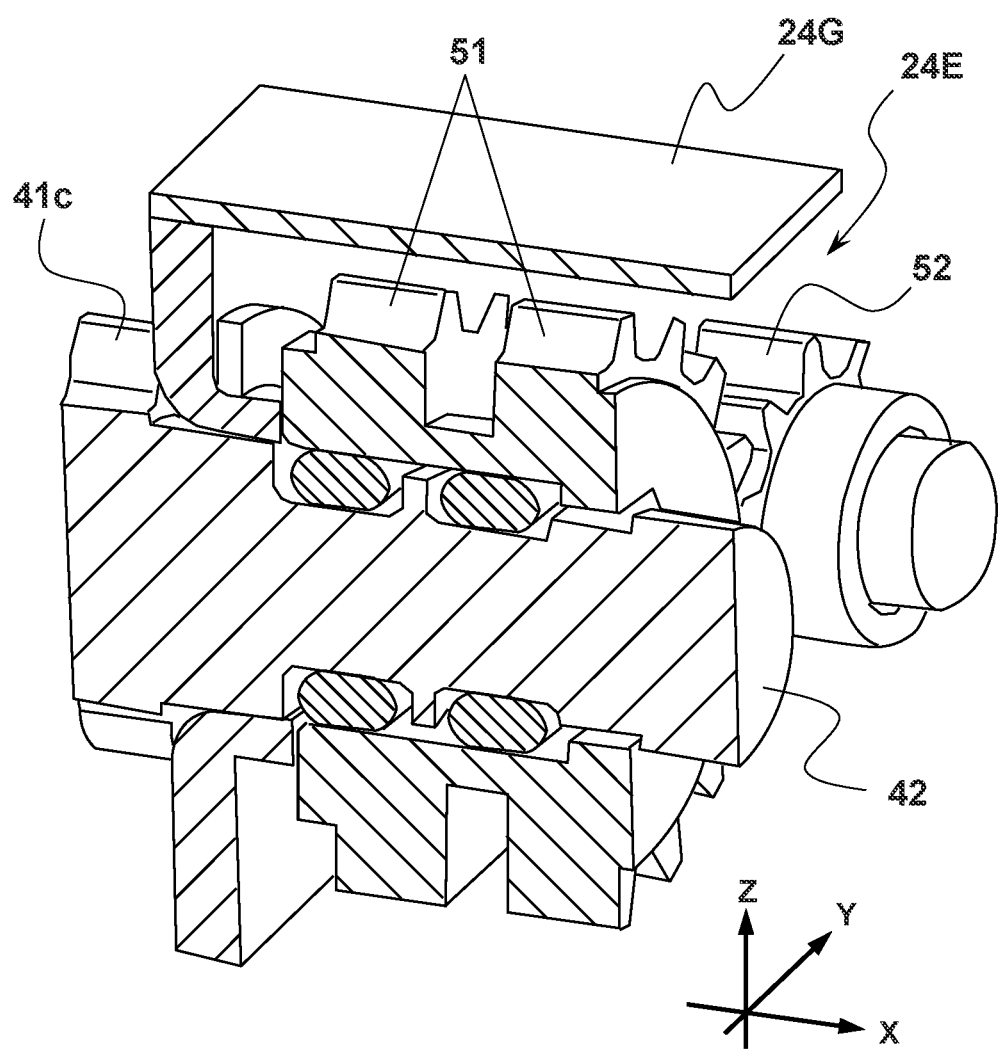
Figure 14A:
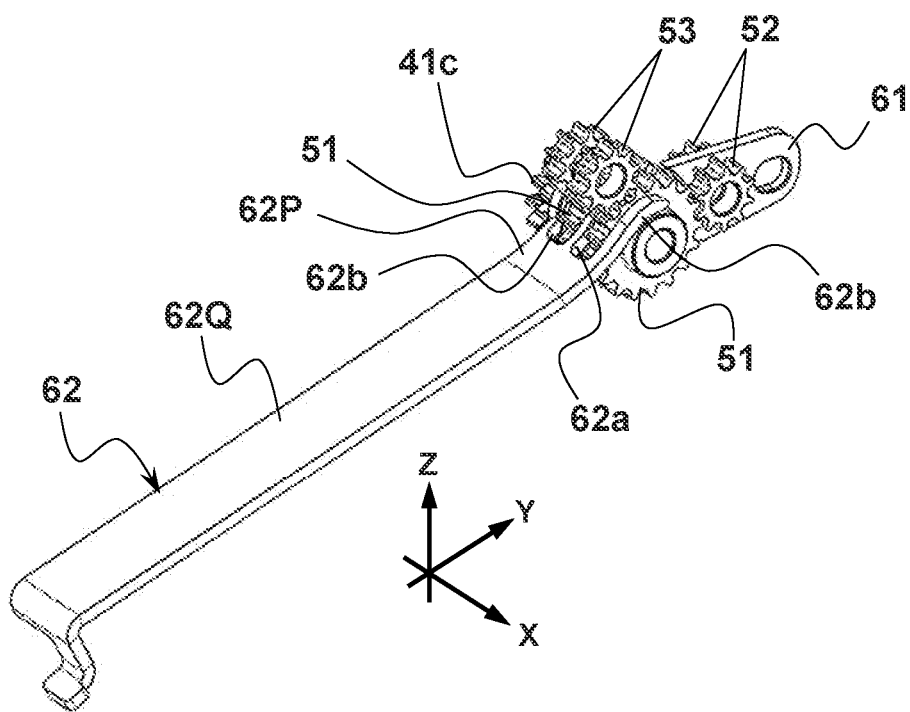
Figure 14B:
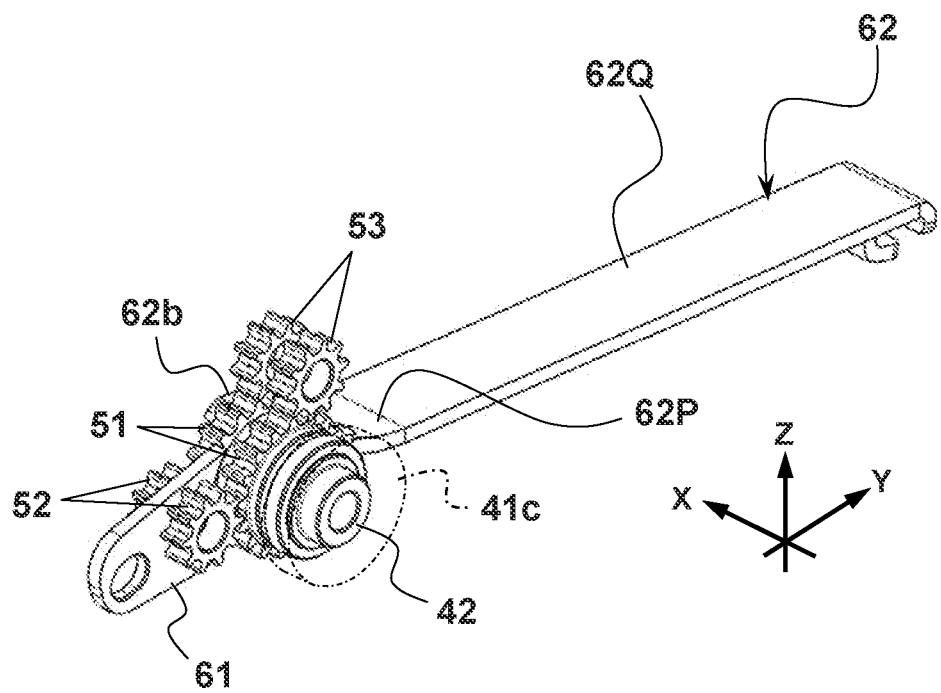
Figure 15:
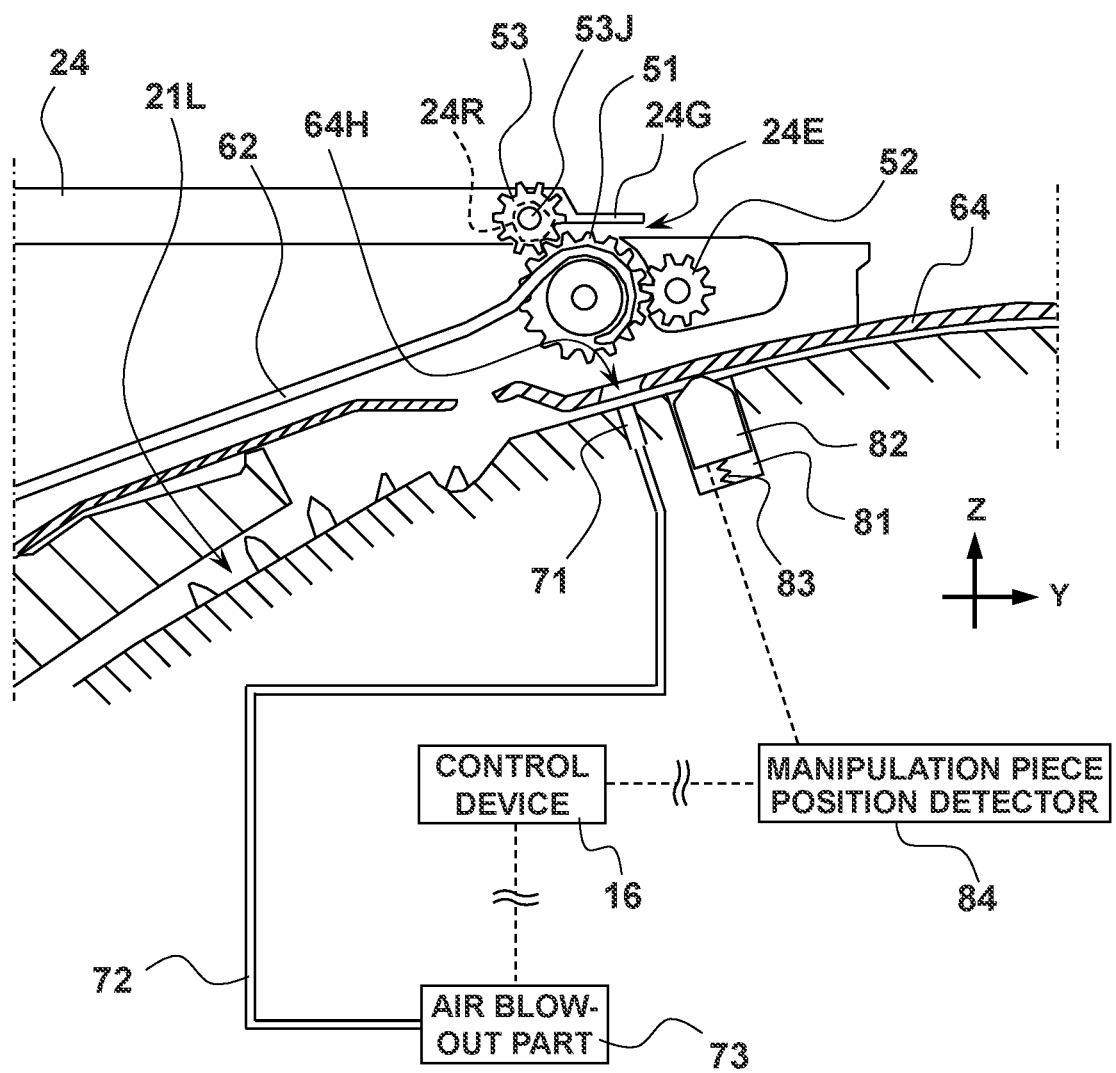
Figure 16A:
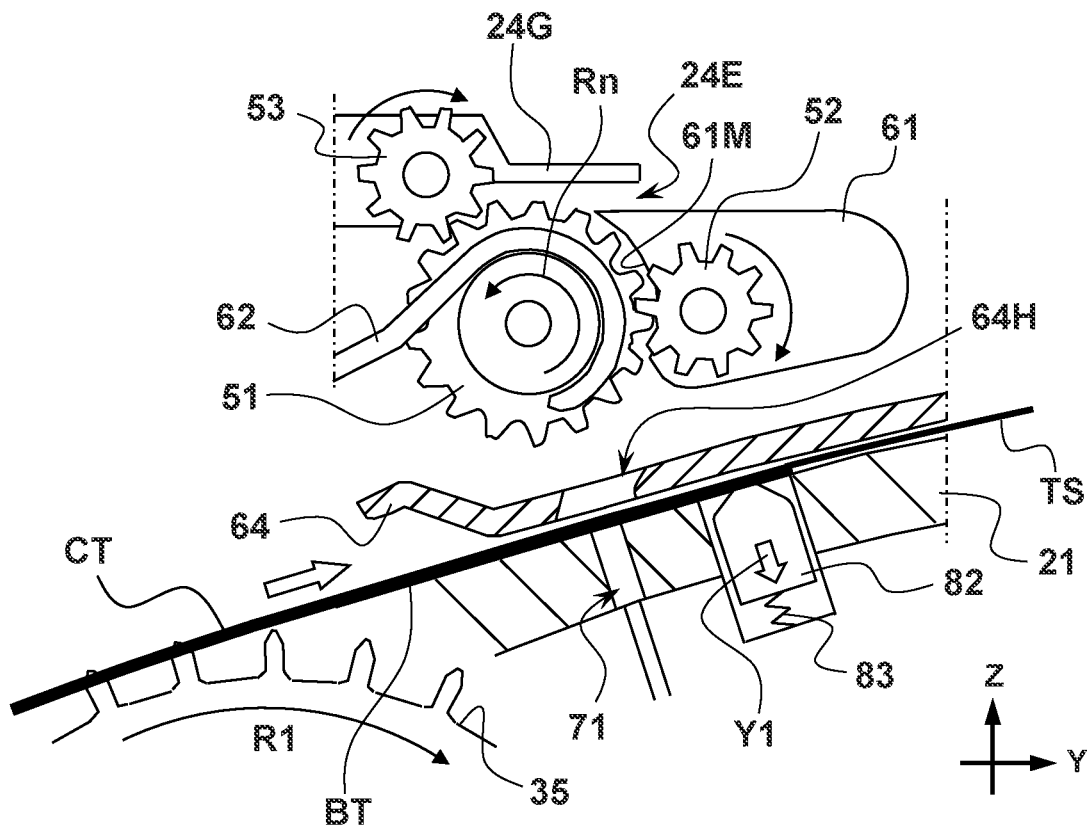
Figure 16B:
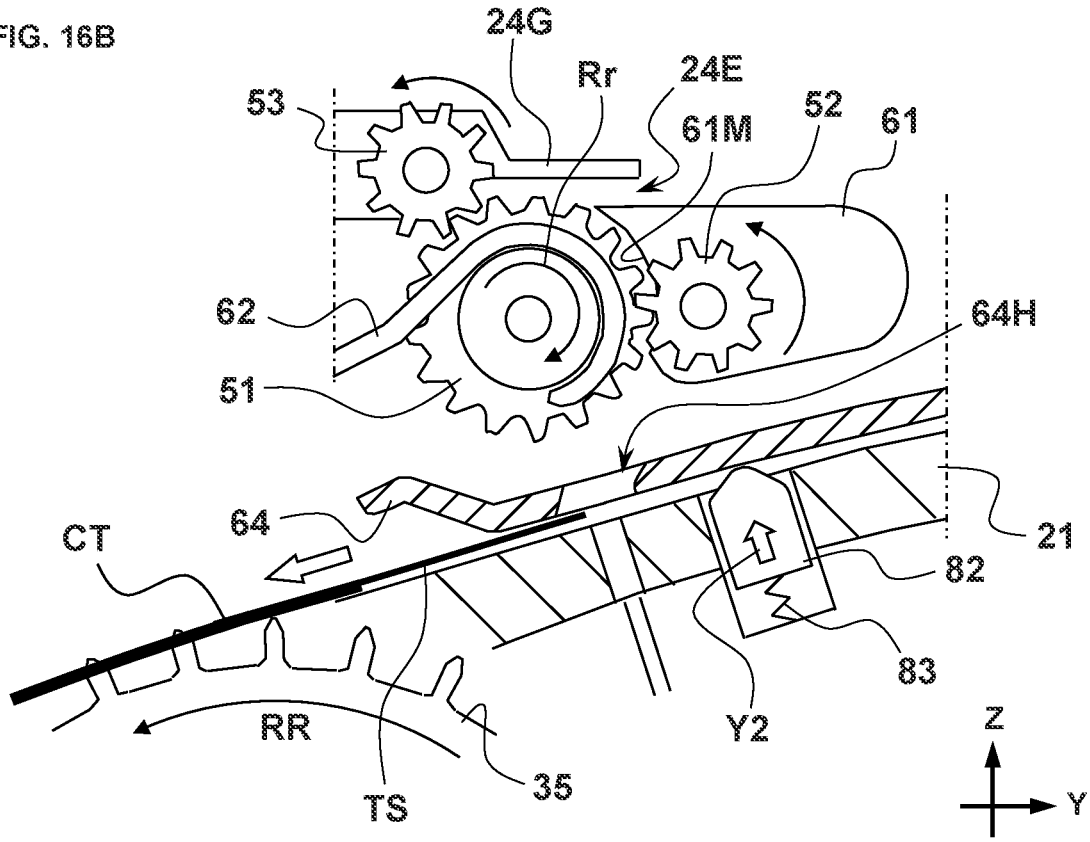
Figure 17A:
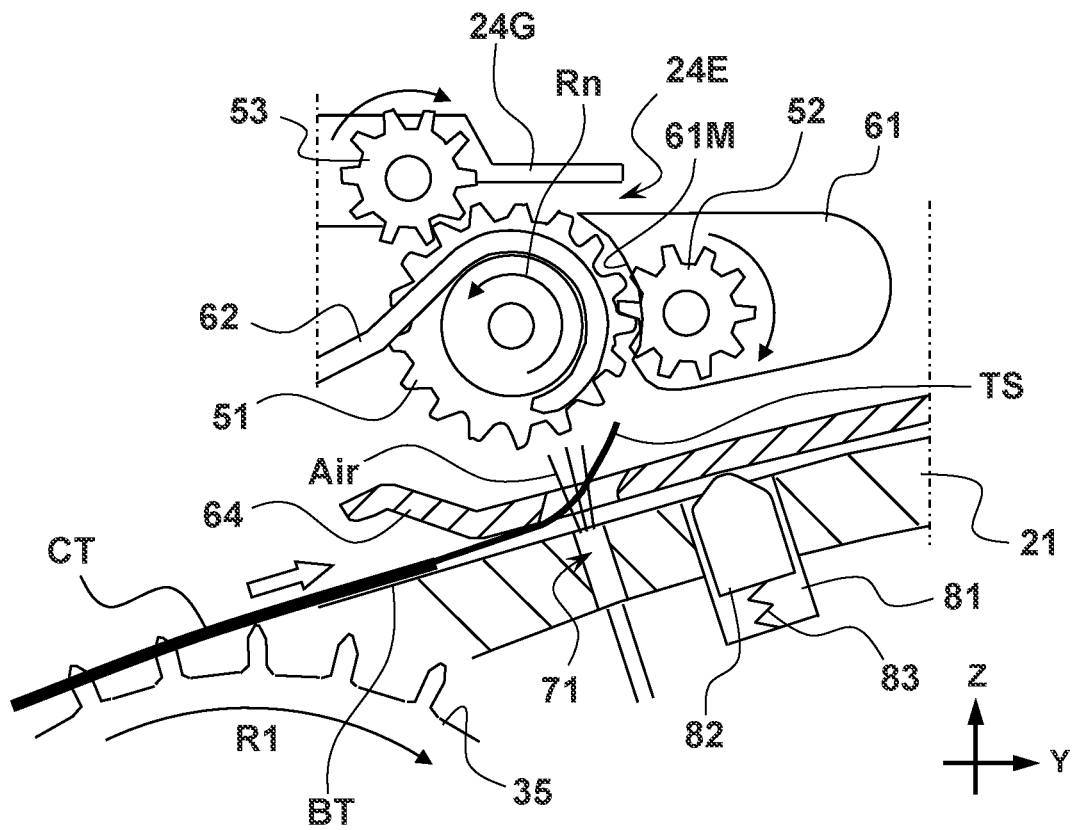
Figure 17B:
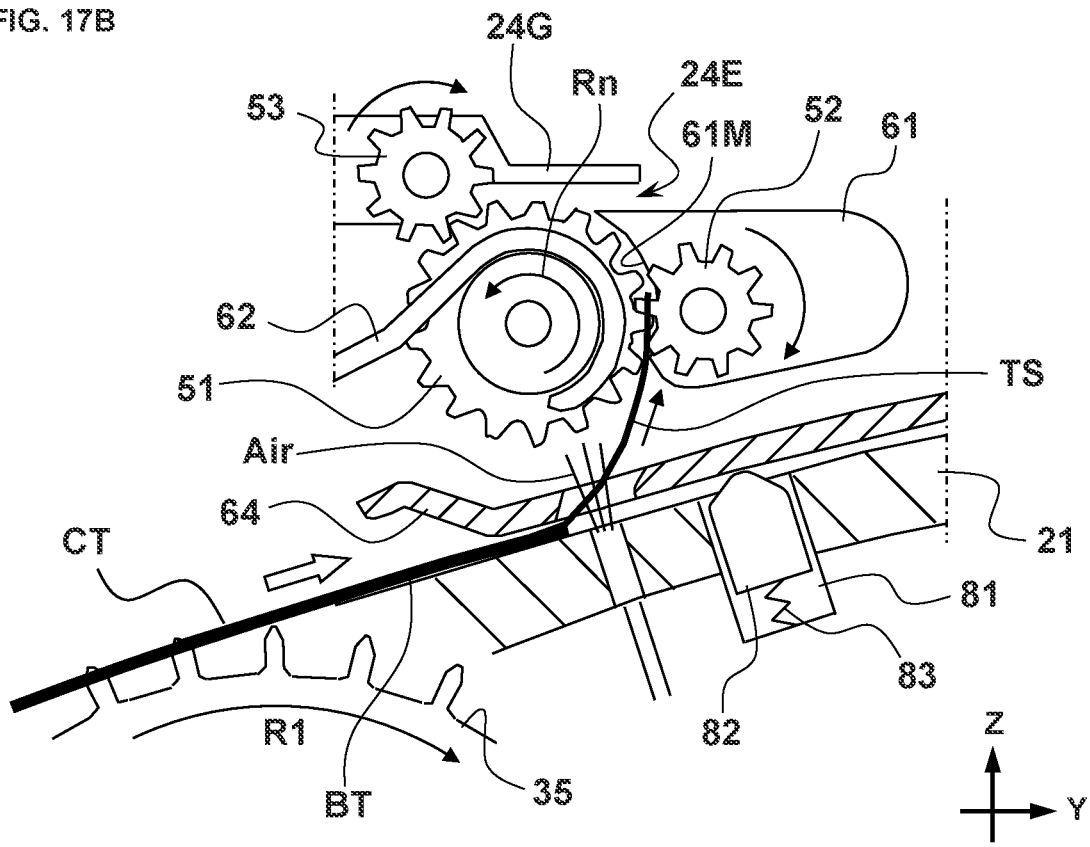
Figure 18A:
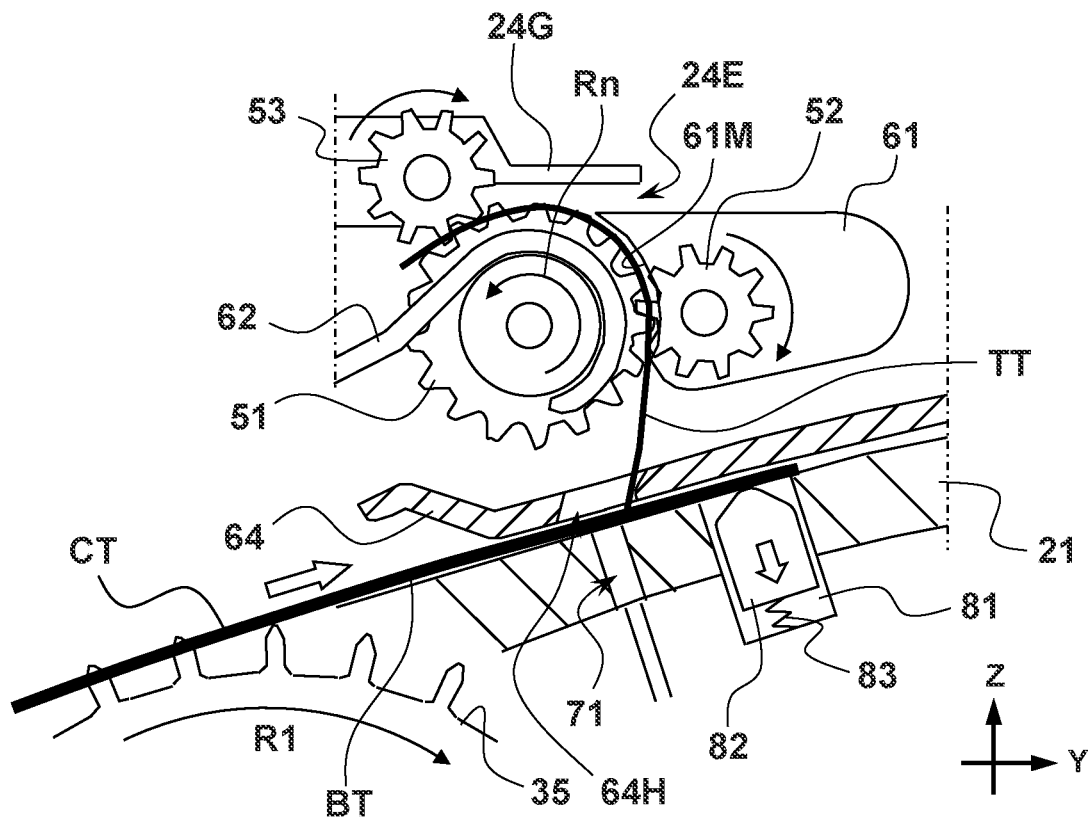
Figure 18B:
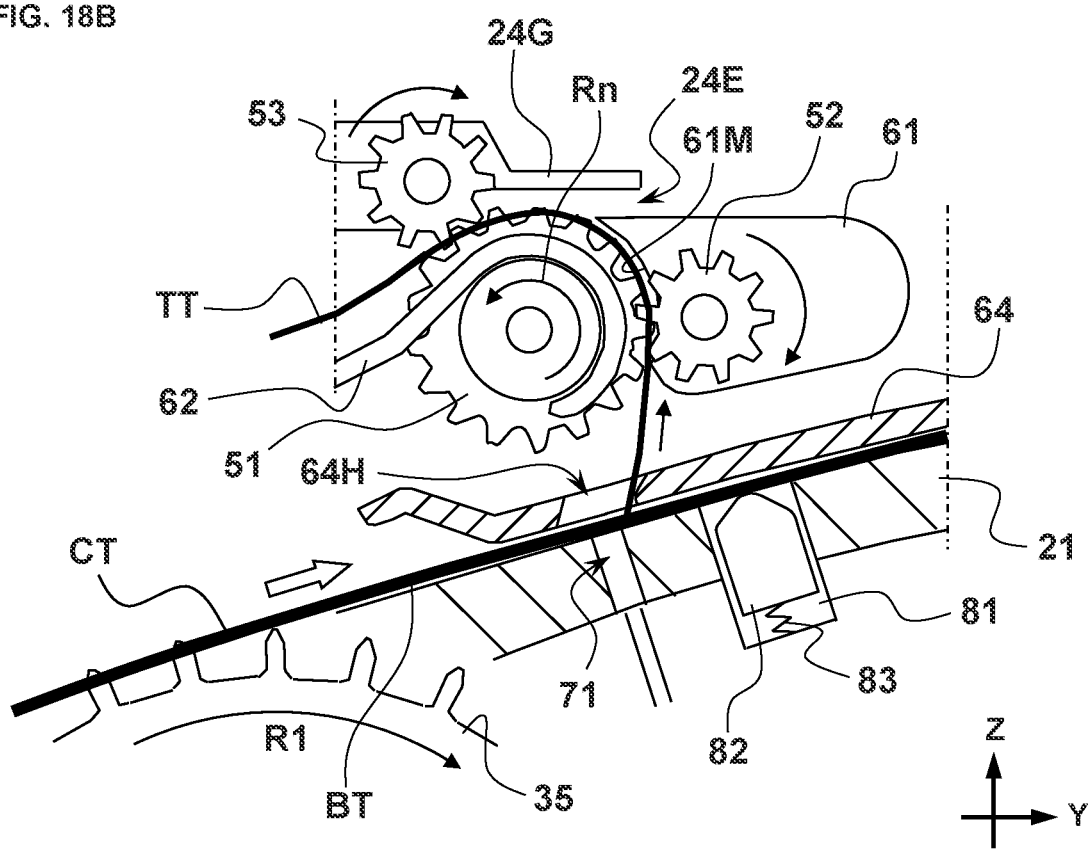
Figure 19A:
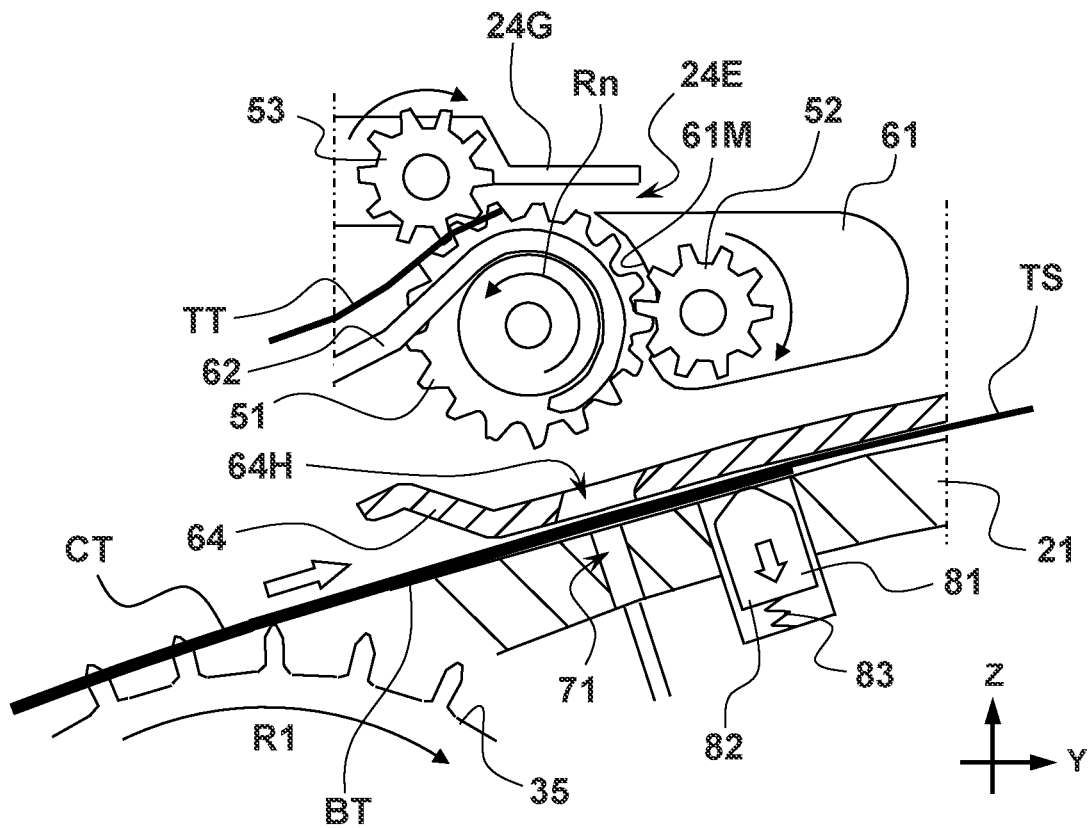
Figure 19B:
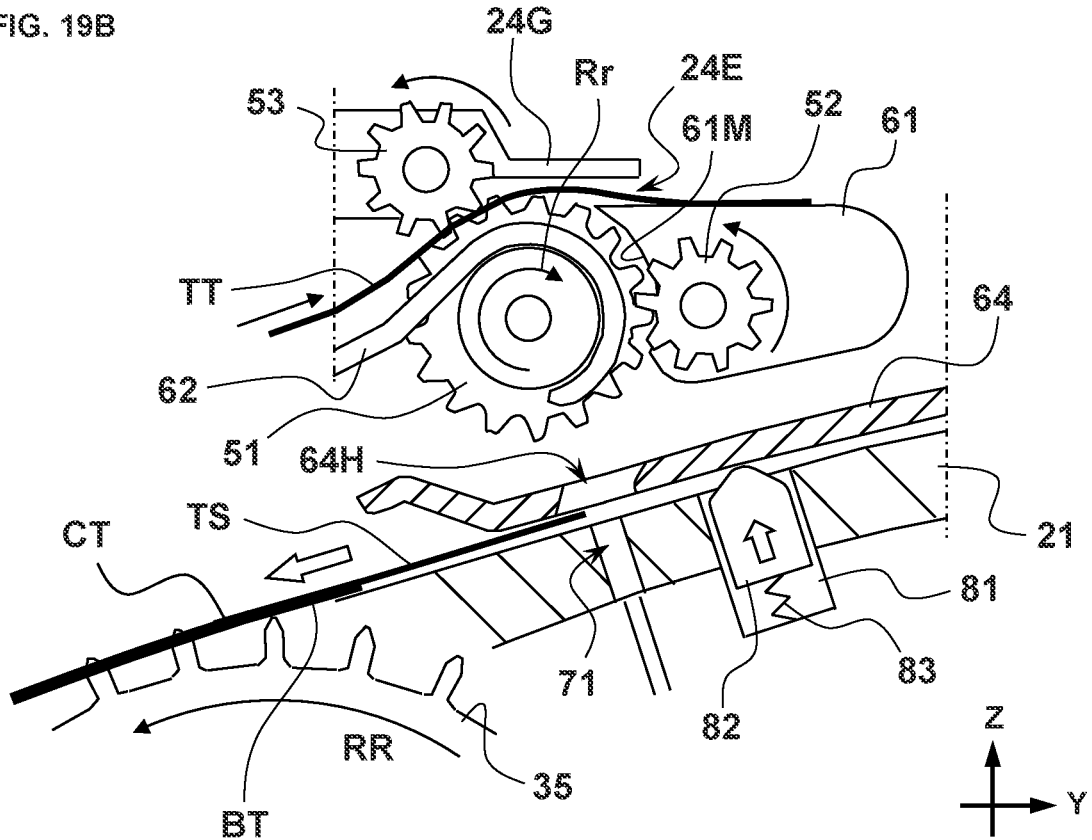

Part (a) of FIG. 9 is a plan view of a part of the tape feeder according to the exemplary embodiment of the present disclosure, and part (b) of FIG. 9 is a side view of a part of the tape feeder according to the exemplary embodiment of the present disclosure;

FIG. 10A is a side view of a neighborhood of a portion where an outer peripheral pin of an introduction sprocket included in the tape feeder and a recess of a wheel contact each other in the exemplary embodiment of the present disclosure;

FIG. 10B is a partial cross-sectional perspective view of a neighborhood of a portion where an outer peripheral pin of an introduction sprocket included in the tape feeder and a recess of a wheel contact each other in the exemplary embodiment of the present disclosure;

FIG. 11 is a cross-sectional perspective view of the neighborhood of the portion where the outer peripheral pin of the introduction sprocket included in the tape feeder and the recess of the wheel contact each other in the exemplary embodiment of the present disclosure;

FIG. 12A, FIG. 12B, and FIG. 12C are side views of the neighborhood of the portion where the outer peripheral pin of the introduction sprocket included in the tape feeder and the recess of the wheel contact each other in the exemplary embodiment of the present disclosure;

FIG. 13 is a cross-sectional perspective view of a part of the tape feeder according to the exemplary embodiment of the present disclosure;

FIG. 14A and FIG. 14B are perspective views each illustrating a second guide member included in the tape feeder according to the exemplary embodiment of the present disclosure together with a peeling gear;

FIG. 15 is a cross-sectional side view of a part of the tape feeder according to the exemplary embodiment of the present disclosure;

FIG. 16A and FIG. 16B are views each for explaining a procedure for conveying the carrier tape by the tape feeder according to the exemplary embodiment of the present disclosure;

FIG. 17A and FIG. 17B are views each for explaining a procedure for conveying the carrier tape by the tape feeder according to the exemplary embodiment of the present disclosure;

FIG. 18A and FIG. 18B are views each for explaining a procedure for conveying the carrier tape by the tape feeder according to the exemplary embodiment of the present disclosure; and FIG. 19A and FIG. 19B are views each for explaining a procedure for conveying the carrier tape by the tape feeder according to the exemplary embodiment of the present disclosure.

DETAILED DESCRIPTIONS

Figure 1:
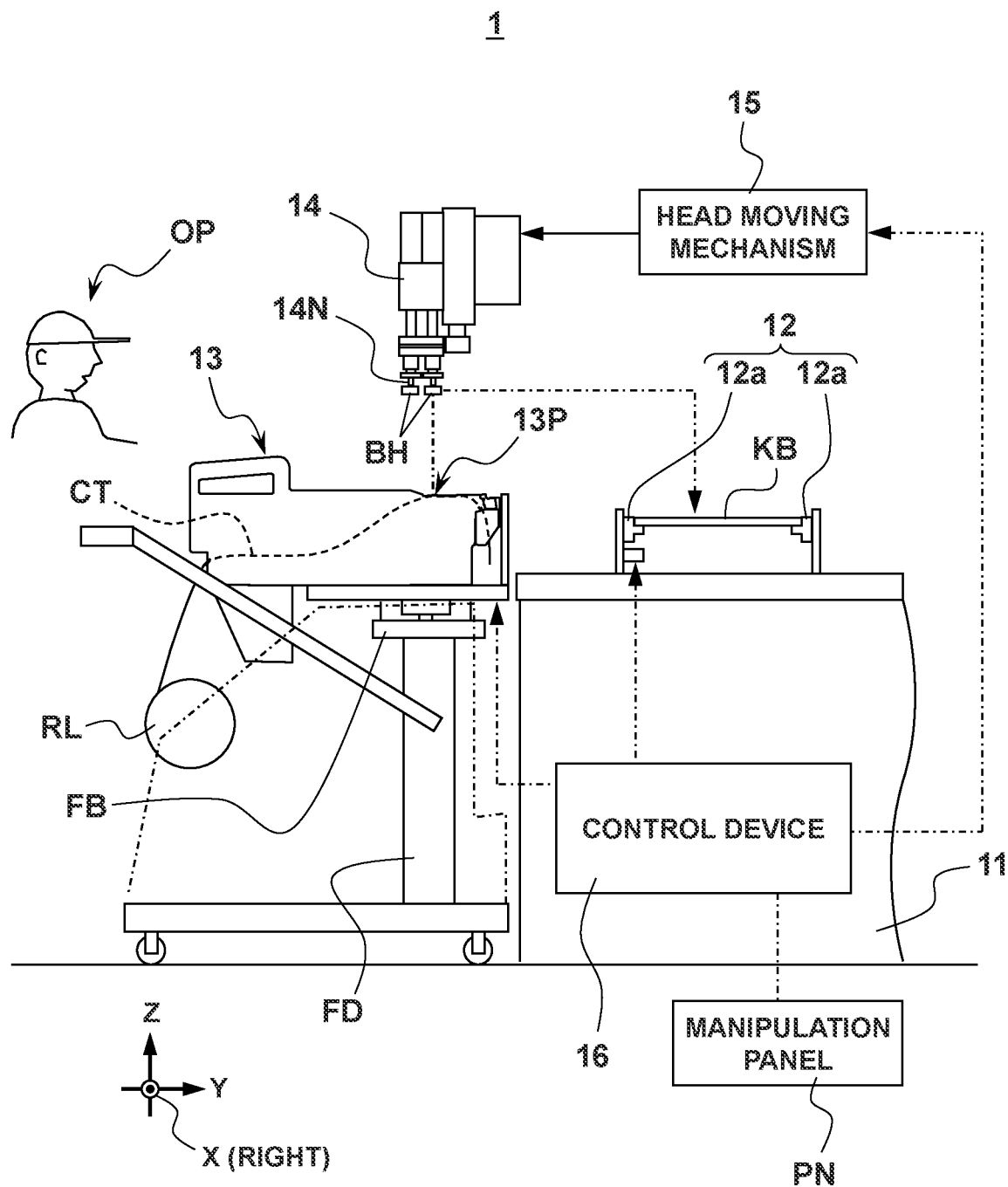
FIG. 1 is a side view illustrating a schematic configuration of a component mounting device including a tape feeder according to one exemplary embodiment of the present disclosure.

In the following, an exemplary embodiment of the present disclosure will be described with reference to the drawings. FIG. 1 shows component mounting device 1 according to the exemplary embodiment of the present disclosure. Component mounting device 1 is a device that repeatedly executes component mounting work of horizontally conveying substrate KB fed from an upstream process side, positioning substrate KB at a work position, mounting component BH on substrate KB, and carrying component BH out to a downstream process side.

In FIG. 1, component mounting device 1 includes base 11, substrate conveyance unit 12, tape feeder 13, mounting head 14, and head moving mechanism 15. In the present exemplary embodiment, for convenience of description, a direction in which substrate KB is conveyed is defined as X direction (a left-right direction as viewed from operator OP), and a horizontal direction orthogonal to X direction is defined as Y direction (a front-rear direction as viewed from operator OP). An up-down direction is defined as Z direction.

In FIG. 1, substrate conveyance unit 12 includes a pair of belt conveyors 12a extending on base 11 in X direction. Substrate conveyance unit 12 conveys substrate KB in X direction and positions substrate KB at the work position by simultaneously causing the pair of belt conveyors 12a to work. Feeder carriage FD is coupled to base 11, and tape feeder 13 is detachably attached to feeder base FB provided at an upper portion of feeder carriage FD. A plurality of tape feeders 13 can be attached to feeder base FB side by side in X direction.

Figure 2:
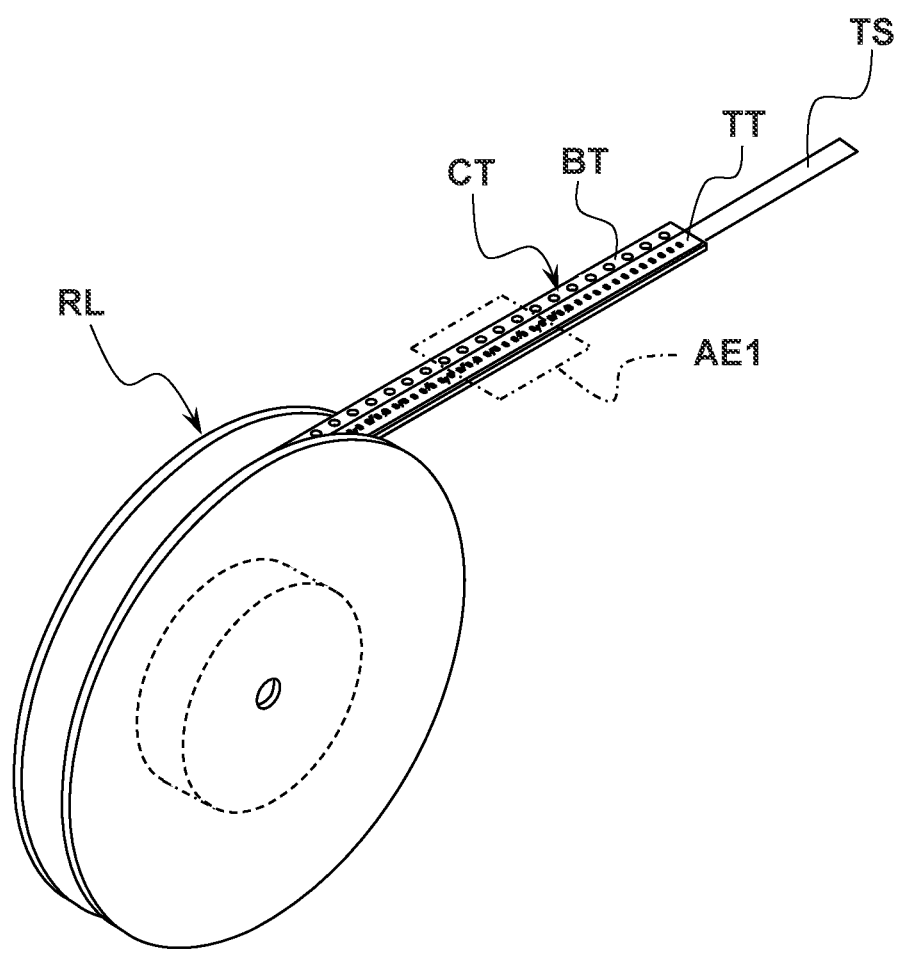
FIG. 2 is a perspective view illustrating a carrier tape used in the tape feeder according to the exemplary embodiment of the present disclosure together with a reel.
Figure 3:
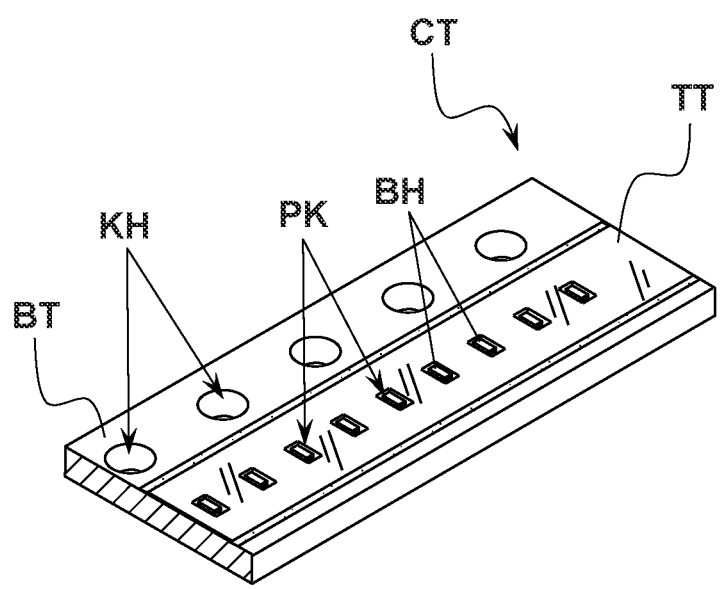
FIG. 3 is a perspective view of a part of the carrier tape used in the tape feeder according to the exemplary embodiment of the present disclosure.

Tape feeder 13 is a component supply unit (component supply device) in component mounting device 1, and conveys carrier tape CT as a component supply tape storing component BH to supply component BH to component supply position 13P (FIG. 1). As illustrated in FIG. 2 and FIG. 3 (FIG. 3 shows region AE1 in FIG. 2), carrier tape CT is configured to include base tape BT and cover tape TT stuck to an upper surface of base tape BT. Carrier tape CT is supplied while being wound around reel RL (FIG. 2).

Base tape BT has a plurality of pockets PK arranged in a line in a longitudinal direction. Each pocket PK stores component BH. Cover tape TT prevents component BH from falling off from each pocket PK in a state of being stuck to base tape BT. Base tape BT has formed a plurality of feed holes KH that are arranged in a line in a longitudinal direction of carrier tape CT in parallel with a row of pockets PK (FIG. 3).

As described above, in the present exemplary embodiment, carrier tape CT is configured to have base tape BT having pocket PK as a storage part in which component BH is stored, and cover tape TT stuck to base tape BT to cover pocket PK.

In FIG. 1, mounting head 14 includes a plurality of nozzles 14N extending downward. Head moving mechanism 15 includes, for example, an XY robot, and moves mounting head 14 in a horizontal plane. Mounting head 14 sucks component BH to a lower end of nozzle 14N to pick up the component, the component having been supplied to component supply position 13P by tape feeder 13. Thus, in the present exemplary embodiment, tape feeder 13 is configured to supply component BH to component mounting device 1 using carrier tape CT as the component supply tape.

In FIG. 1, component mounting device 1 includes control device 16. Control device 16 controls each operation of substrate conveyance unit 12, each tape feeder 13, mounting head 14, and head moving mechanism 15. Manipulation panel PN is connected to control device 16. Operator OP can perform input operation to control device 16 through manipulation panel PN.

When component mounting device 1 performs the component mounting work, control device 16 first causes substrate conveyance unit 12 to work, thereby receiving substrate KB fed from the upstream process side and conveying substrate KB to the work position to position the substrate. Then, after substrate KB is positioned, the control device causes head moving mechanism 15 to work, thereby causing mounting head 14 to repeatedly perform component moving operation while causing tape feeder 13 to work to supply component BH to component supply position 13P. The component moving operation includes operation of causing nozzle 14N to suck component BH supplied by tape feeder 13, and operation of mounting component BH sucked by nozzle 14N onto substrate KB.

After causing mounting head 14 to repeatedly perform the component moving operation to mount all components BH to be mounted on substrate KB, control device 16 causes substrate conveyance unit 12 to work to carry out substrate KB to the downstream process side. As a result, the component mounting work per one substrate KB is completed.

Figure 4:
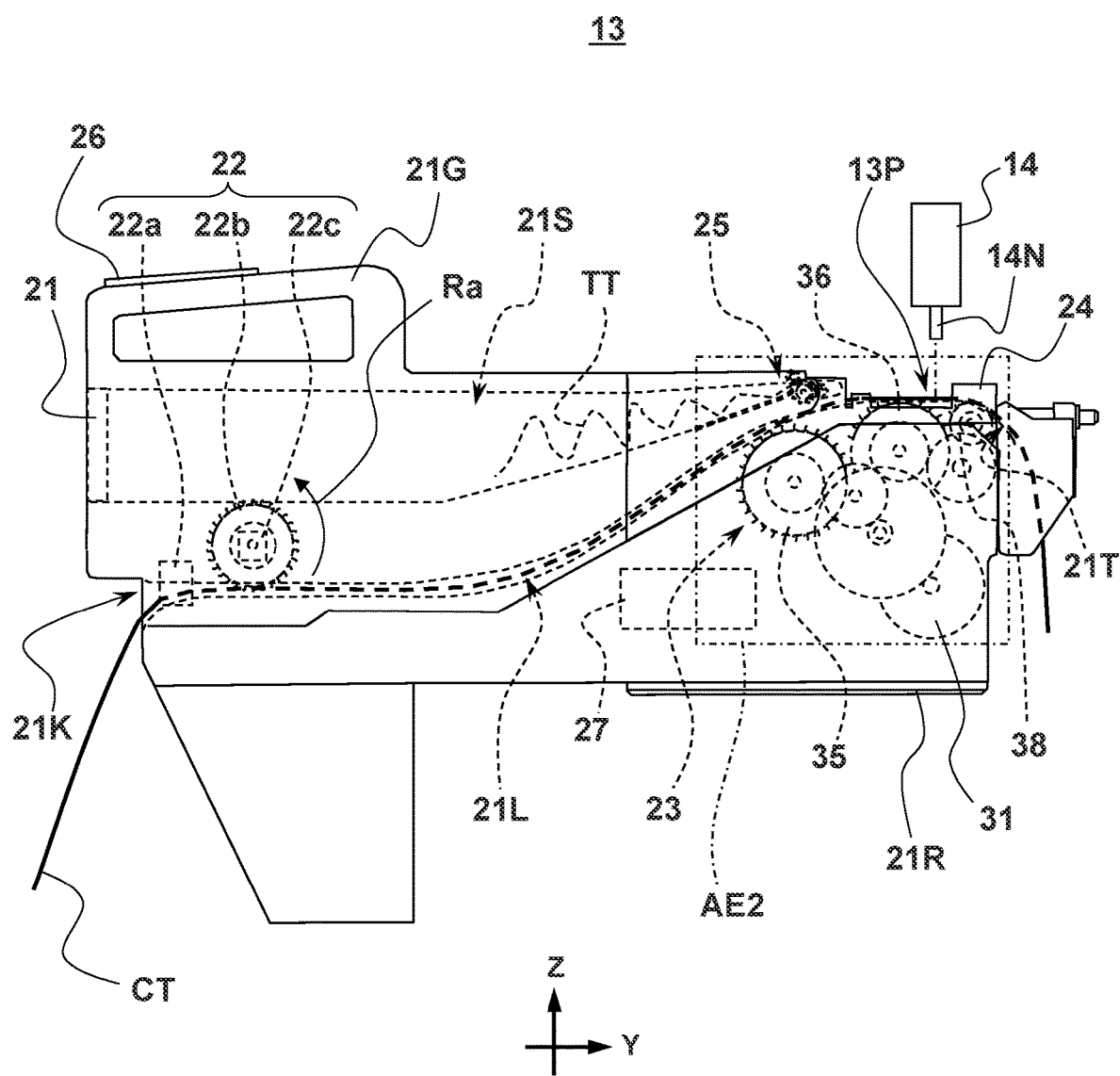
FIG. 4 is a side view of the tape feeder according to the exemplary embodiment of the present disclosure.

Next, a configuration and operation of tape feeder 13 will be described. As illustrated in FIG. 4, tape feeder 13 includes frame 21, tape draw-in mechanism 22, conveyance mechanism 23, cover member 24, cover tape peeling mechanism 25, manipulation and display part 26, and controller 27.

Frame 21 of tape feeder 13 is attached to feeder base FB of feeder carriage FD. In a state where tape feeder 13 (frame 21) is attached to feeder base FB, a width direction of frame 21 coincides with X direction, and the front-rear direction coincides with Y direction. Of ends of frame 21 in Y direction, a side close to substrate conveyance unit 12 is referred to as a front end side, and a side away from substrate conveyance unit 12 is referred to as a rear end side.

In FIG. 4, conveyance path 21L of carrier tape CT extending from the rear end side to the front end side of frame 21 is provided in frame 21. Conveyance path 21L has tape inlet 21K (an introduction position of carrier tape CT) opened at the rear end of frame 21, and tape outlet 21T opened at the front end side of frame 21.

Carrier tape CT is inserted from tape inlet 21K and conveyed so as to be ejected from tape outlet 21T. Hereinafter, a side of frame 21 on which tape inlet 21K is provided is referred to as an "upstream side", and a side on which tape outlet 21T is provided is referred to as "downstream side".

In FIG. 4, conveyance path 21L is formed as a whole in a route extending from an upstream side lower portion toward a downstream side upper portion in frame 21. Specifically, conveyance path 21L is formed in a route extending substantially along Y direction from tape inlet 21K toward the downstream side, extending obliquely upward from an intermediate portion of frame 21 toward the downstream side, and then extending further toward the downstream side in a state of being exposed at an upper portion of frame 21 to reach tape outlet 21T.

In FIG. 4, a hollow region is formed on the upstream side of frame 21. As will be described later, the hollow region is a housing part 21S in which cover tape TT peeled off from base tape BT is housed.

In FIG. 4, a coupling part 21R having a shape extending in Y direction is provided in a downstream side lower portion of frame 21. Tape feeder 13 is coupled to feeder base FB (i.e., to feeder carriage FD) by insertion of coupling part 21R into a slot (not illustrated) provided in feeder base FB.

In FIG. 4, tape draw-in mechanism 22 includes insertion detector 22a, draw-in sprocket 22b, and draw-in motor 22c. Insertion detector 22a is provided at the upstream side lower portion of frame 21, and detects a head portion of carrier tape CT inserted into conveyance path 21L from tape inlet 21K.

Draw-in sprocket 22b, which is also located at the upstream side lower portion of frame 21, is rotatably provided around a shaft along X direction (i.e., in a direction along YZ plane). Draw-in sprocket 22b has a plurality of pins (not illustrated) on an outer peripheral portion thereof, and a lowermost pin among the plurality of pins is located in conveyance path 21L.

When insertion detector 22a detects the head portion of carrier tape CT being inserted into tape inlet 21K, draw-in motor 22c rotates draw-in sprocket 22b. At this time, draw-in sprocket 22b is rotated in a direction (arrow Ra in FIG. 4) in which a pin on a lower end side moves toward the downstream side.

When draw-in sprocket 22b rotates in the direction in which the pin on the lower end side moves toward the downstream side, the lowermost pin of draw-in sprocket 22b is engaged with feed hole KH of carrier tape CT in conveyance path 21L, and carrier tape CT is conveyed in a downstream direction (a direction toward the downstream side, i.e., a direction from a left side toward a right side of a sheet of FIG. 4). As a result, carrier tape CT is drawn into frame 21, and the head portion of carrier tape CT advances on conveyance path 21L toward the downstream side.

In FIG. 4, conveyance mechanism 23 is provided on the downstream side of frame 21. Conveyance mechanism 23 is a mechanism part that receives carrier tape CT drawn into conveyance path 21L by tape draw-in mechanism 22 and conveys carrier tape CT toward component supply position 13P. As described above, in the present exemplary embodiment, tape feeder 13 is configured to include conveyance path 21L leading from tape inlet 21K, which is an introduction position of carrier tape CT, to component supply position 13P, and conveyance mechanism 23 that conveys carrier tape CT on conveyance path 21L to component supply position 13P.

Figure 5:
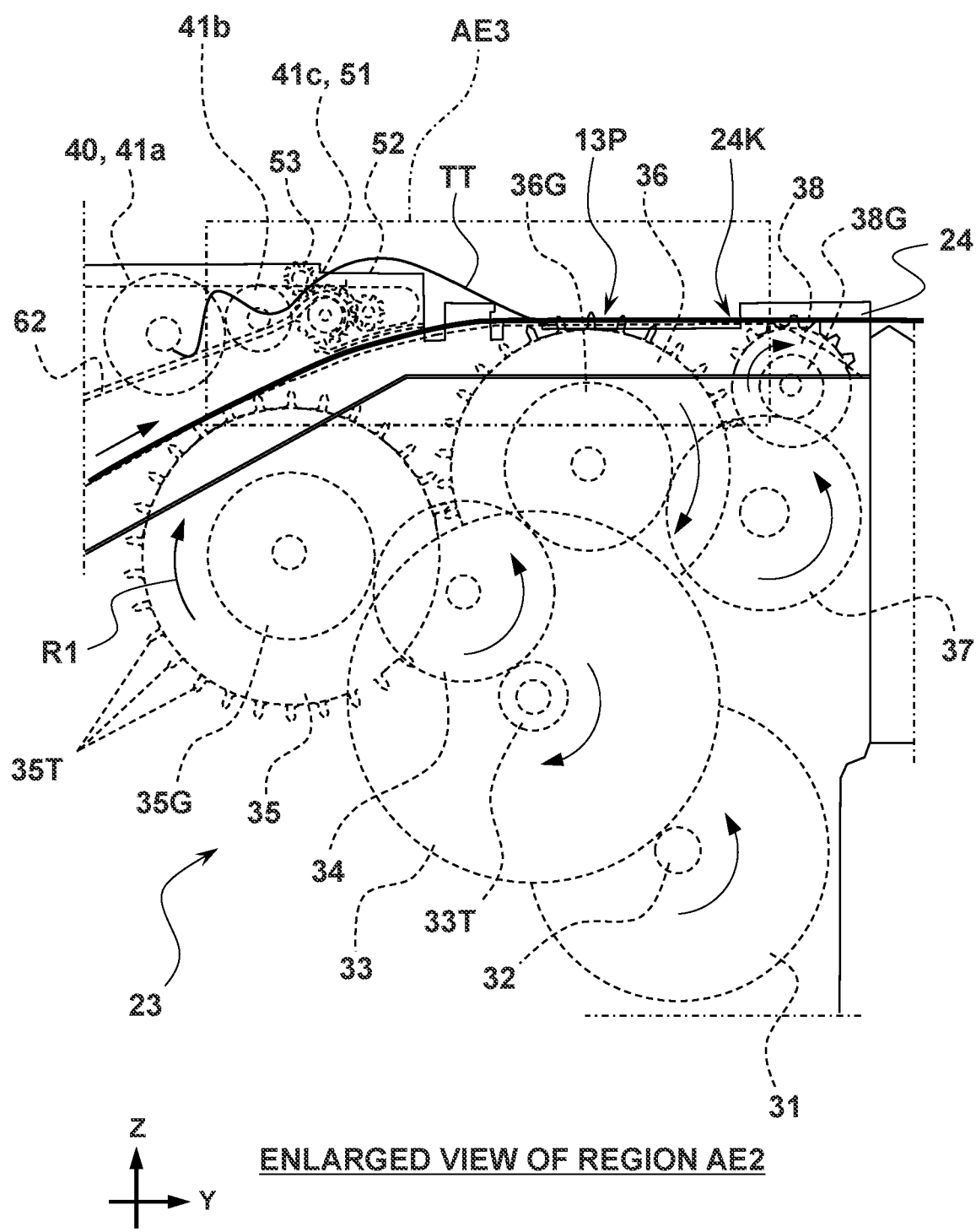
FIG. 5 is a side view of a part of the tape feeder according to the exemplary embodiment of the present disclosure.

In FIG. 5 (FIG. 5 is an enlarged view of region AE2 in FIG. 4), conveyance mechanism 23 includes drive motor 31, drive gear 32, reduction gear 33, first intermediate gear 34, introduction sprocket 35, positioning sprocket 36, second intermediate gear 37, and ejection sprocket 38. Drive motor 31 is installed at the downstream side lower portion of frame 21, and rotates drive gear 32 around a shaft along X direction. Drive motor 31 is capable of rotating drive gear 32 in either of forward and reverse directions.

Reduction gear 33 and first intermediate gear 34 are each rotatably provided around a shaft along X direction. Reduction gear 33 meshes with drive gear 32 (FIG. 5). Reduction gear 33 is formed integrally with small-diameter gear 33T provided concentrically with the reduction gear, and small-diameter gear 33T meshes with first intermediate gear 34 (FIG. 5). Reduction gear 33 decelerates rotation of drive motor 31, increases a torque generated by drive motor 31, and transmits the increased torque to first intermediate gear 34.

In FIG. 5, introduction sprocket 35 is located above an upstream side of first intermediate gear 34 and below an obliquely upward extending part of an intermediate portion of conveyance path 21L. Introduction sprocket 35 is rotatable around a shaft along X direction, and of a plurality of pins provided on an outer periphery thereof (referred to as "outer peripheral pins 35T"), a pin located slightly upstream side of an uppermost pin is located in conveyance path 21L (FIG. 5).

Introduction sprocket 35 is configured integrally with introduction sprocket drive gear 35G provided concentrically with the introduction sprocket. Introduction sprocket drive gear 35G meshes with first intermediate gear 34 (FIG. 5). Therefore, when first intermediate gear 34 rotates, introduction sprocket 35 rotates via introduction sprocket drive gear 35G.

In FIG. 5, positioning sprocket 36 is provided slightly downstream above first intermediate gear 34 (above a downstream side of introduction sprocket 35) and below conveyance path 21L. Positioning sprocket 36 is rotatable around a shaft along X direction, and an uppermost pin among a plurality of pins provided on an outer periphery of the positioning sprocket is located in conveyance path 21L (FIG. 5).

Positioning sprocket 36 is configured integrally with positioning sprocket drive gear 36G provided concentrically with the positioning sprocket. Positioning sprocket 36 meshes with first intermediate gear 34 (FIG. 5), and when first intermediate gear 34 rotates, positioning sprocket rotates in the same direction as introduction sprocket 35 via positioning sprocket drive gear 36G.

In FIG. 5, second intermediate gear 37 is located below a downstream side of positioning sprocket 36. Second intermediate gear 37 is rotatable around a shaft along X direction and meshes with positioning sprocket drive gear 36G.

In FIG. 5, ejection sprocket 38 is provided on the downstream side of positioning sprocket 36 and below conveyance path 21L (above second intermediate gear 37). Ejection sprocket 38 is rotatable around a shaft along X direction, and an uppermost pin among a plurality of pins provided on an outer periphery of the ejection sprocket is located in conveyance path 21L.

Ejection sprocket 38 is configured integrally with ejection sprocket drive gear 38G provided concentrically the with the ejection sprocket. Ejection sprocket 38 meshes with second intermediate gear 37 (FIG. 5), and when second intermediate gear 37 rotates, ejection sprocket 38 rotates in the same direction as positioning sprocket 36 (and introduction sprocket 35) via ejection sprocket drive gear 38G.

As described above, in tape feeder 13 according to the present exemplary embodiment, introduction sprocket 35, positioning sprocket 36, and ejection sprocket 38 are configured to rotate in the same direction upon reception of a driving force of drive motor 31.

As described above, some of the pins provided on the outer periphery of each of the three sprockets (introduction sprocket 35, positioning sprocket 36, and ejection sprocket 38) constituting conveyance mechanism 23 are located in conveyance path 21L. Each of introduction sprocket 35, positioning sprocket 36, and ejection sprocket 38 rotates with a pin engaged with feed hole KH of carrier tape CT on conveyance path 21L, thereby conveying carrier tape CT.

Introduction sprocket 35 rotates in a direction in which outer peripheral pin 35T on an upper end side is moved to the downstream side (arrow R1 illustrated in FIG. 5), thereby conveying carrier tape CT on conveyance path 21L in the downstream direction.

The rotation direction of introduction sprocket 35 is hereinafter referred to as "tape advancing direction". Positioning sprocket 36 and ejection sprocket 38 also rotate in a direction in which the pins on the upper end side are moved to the downstream side in this manner, thereby conveying carrier tape CT in the downstream direction.

Introduction sprocket 35 receives carrier tape CT fed from draw-in sprocket 22b and conveys the fed carrier tape CT in the downstream direction. Positioning sprocket 36 conveys carrier tape CT received from introduction sprocket 35 in the downstream direction, and ejection sprocket 38 conveys carrier tape CT received from positioning sprocket 36 in the downstream direction, and ejects carrier tape CT from tape outlet 21T of frame 21.

Introduction sprocket 35 also rotates in a direction in which outer peripheral pin 35T on the upper end side is moved to the upstream side (a direction opposite to arrow R1 illustrated in FIG. 5), thereby conveying carrier tape CT on conveyance path 21L in the upstream direction (a direction toward the upstream side, i.e., a direction from the right side toward the left side of the sheet of FIG. 4). A rotation direction of introduction sprocket 35 that conveys carrier tape CT in the upstream direction in a manner as described above is hereinafter referred to as "tape retracting direction". Note that the rotation of introduction sprocket 35 in the tape retracting direction is performed with an extremely small rotation amount in a situation where the head portion of carrier tape CT is not delivered from introduction sprocket 35 to positioning sprocket 36 (to be described later).

In FIG. 5, cover member 24 is provided to extend in Y direction above conveyance mechanism 23. Cover member 24 covers a downstream side upper portion of frame 21 from above, and has a function of pressing, from above, carrier tape CT conveyed on conveyance path 21L by the three sprockets (introduction sprocket 35, positioning sprocket 36, and ejection sprocket 38) constituting conveyance mechanism 23.

Figure 6:
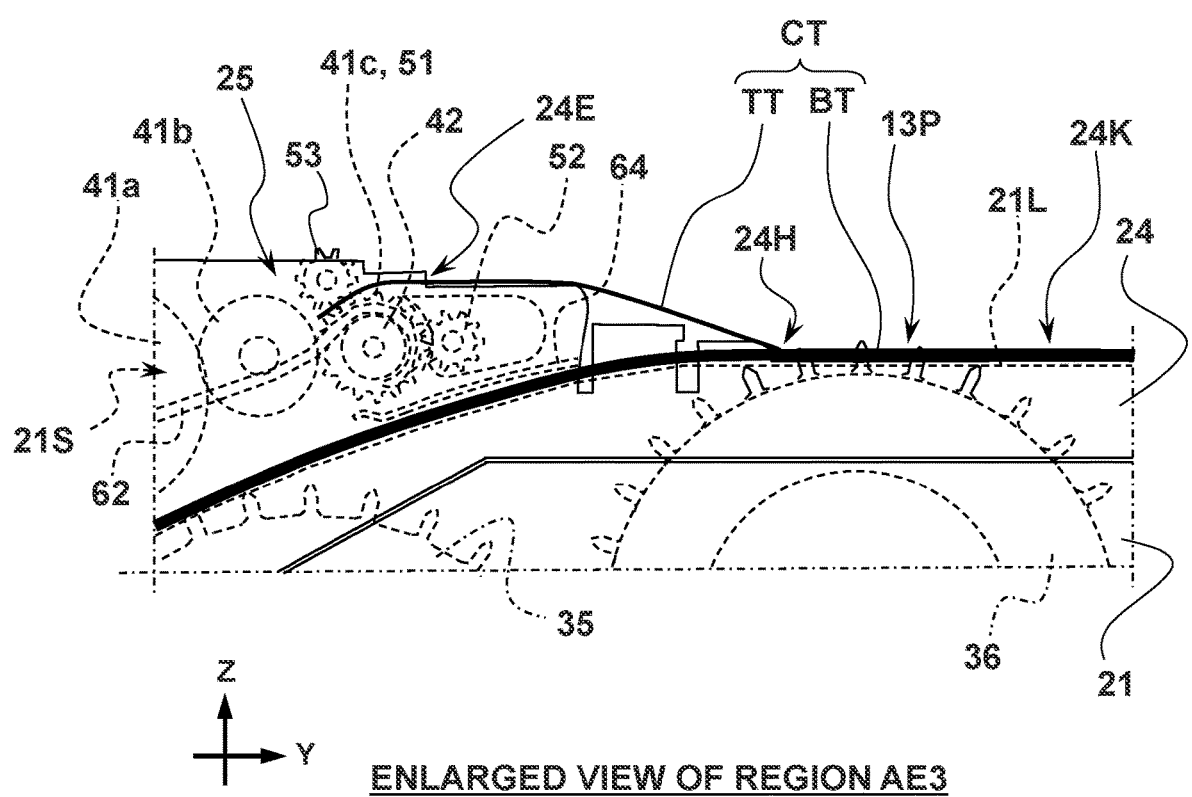
FIG. 6 is a side view of a part of the tape feeder according to the exemplary embodiment of the present disclosure.

In FIG. 5 and FIG. 6 (FIG. 6 is an enlarged view of region AE3 in FIG. 5), opening 24K opened upward is provided in an intermediate portion of cover member 24 in Y direction. Component supply position 13P is set in opening 24K.

Figure 7:
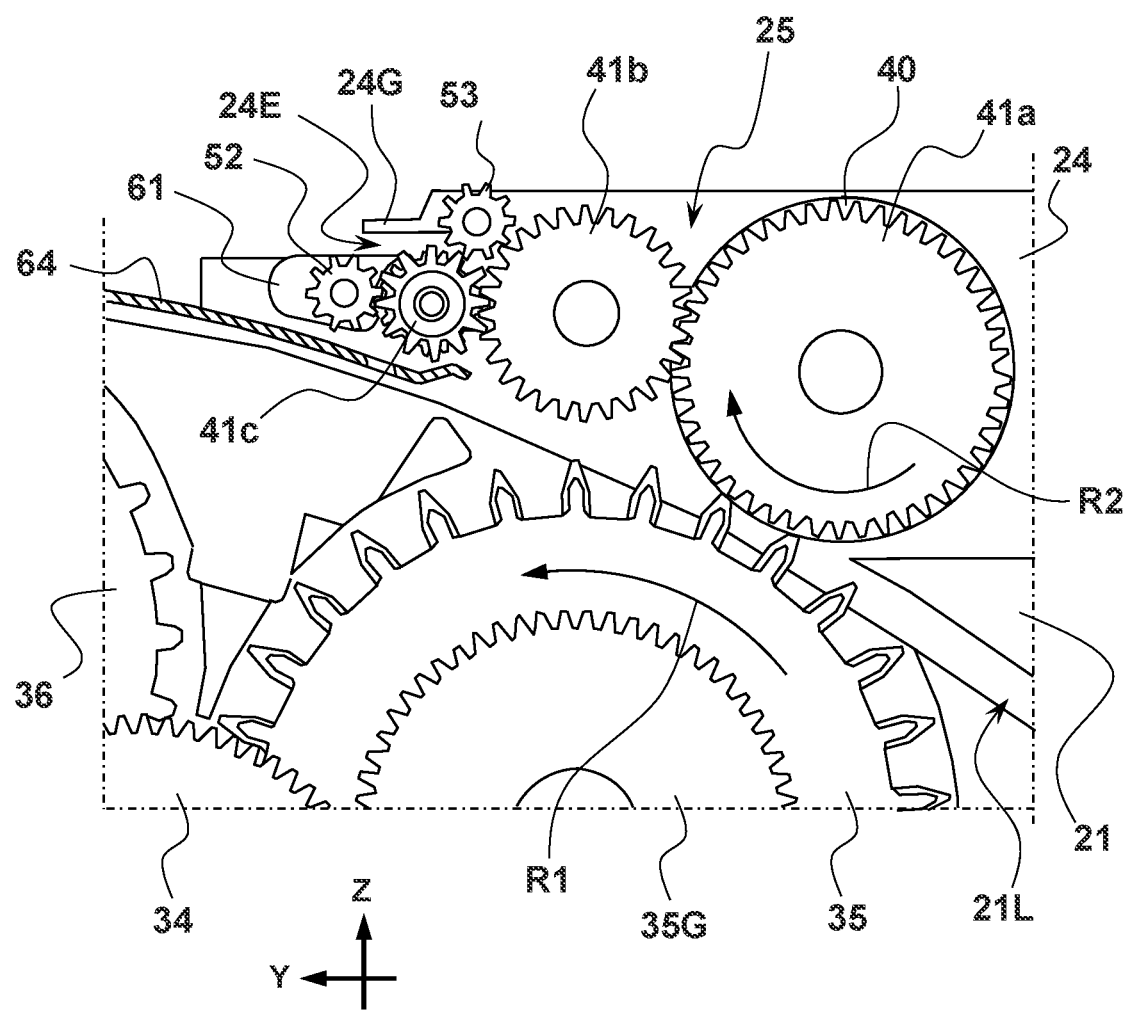
FIG. 7 is a side view of a part of the tape feeder according to the exemplary embodiment of the present disclosure.
Figure 8:
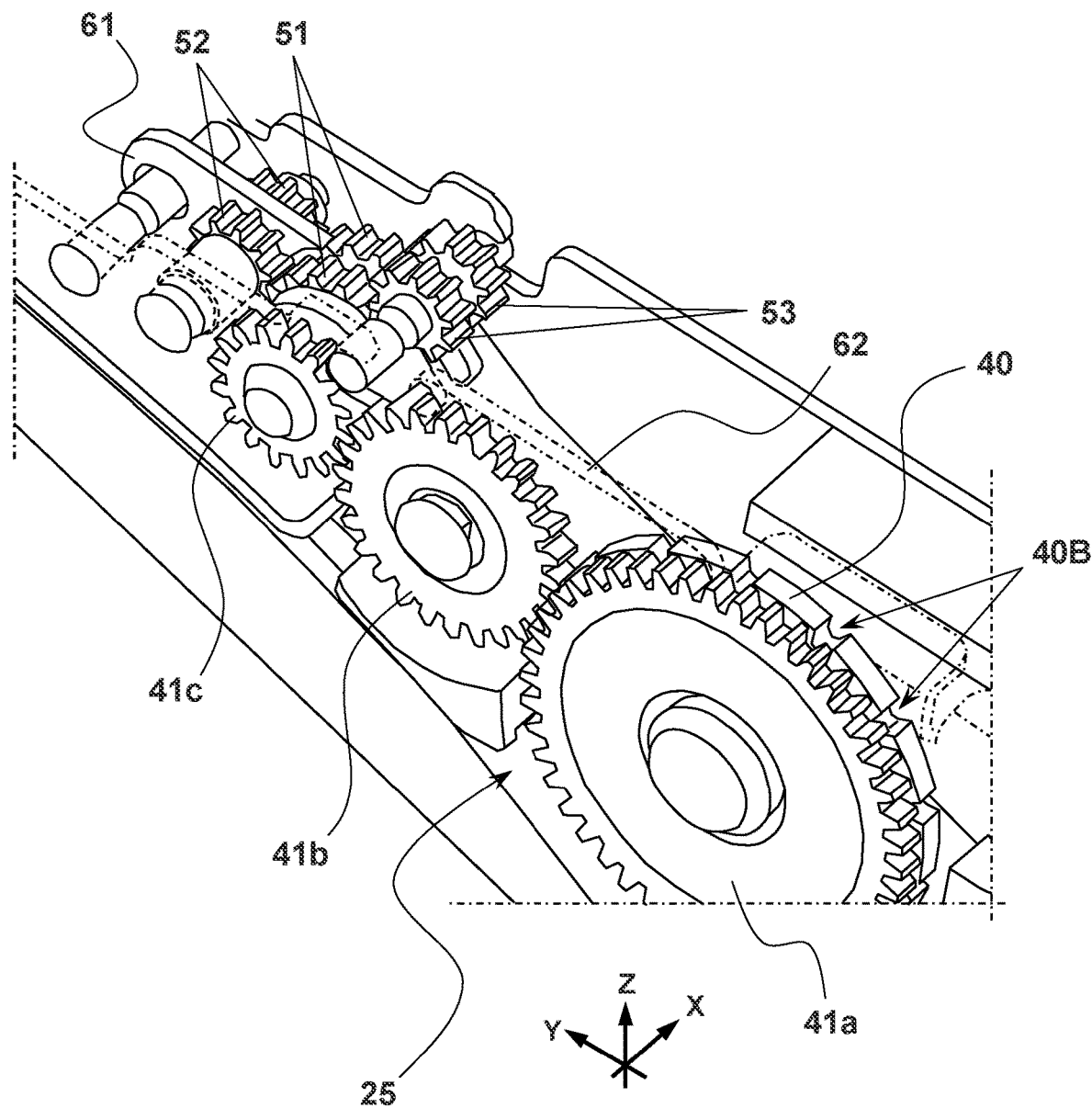
FIG. 8 is a perspective view of a part of the tape feeder according to the exemplary embodiment of the present disclosure.

In FIG. 6, FIG. 7, FIG. 8, and part (a) and part (b) of FIG. 9, cover tape peeling mechanism 25 includes wheel 40, three transmission gears, and three peeling gears. The three transmission gears include first transmission gear 41a, second transmission gear 41b, and third transmission gear 41c, each of which is rotatable around a shaft along the X direction. The three peeling gears include first peeling gear 51, second peeling gear 52, and third peeling gear 53, each of which is rotatable around a shaft along the X direction.

In FIG. 7, FIG. 8, and part (b) of FIG. 9, wheel 40 is provided at a position opposed to introduction sprocket 35 across conveyance path 21L (above conveyance path 21L). Wheel 40 is made of a member having a disk-shape (disk-shaped member) expanding along YZ plane, and is provided rotatably around a shaft along X direction.

A plurality of recesses 40B are provided on an outer periphery of wheel 40 (FIG. 8, and FIG. 10A and FIG. 10B). Recesses 40B are arranged at a pitch corresponding to a pitch of outer peripheral pins 35T of introduction sprocket 35. In a state where introduction sprocket 35 is rotating, outer peripheral pin 35T is inserted into recess 40B of wheel 40 from below to bring outer peripheral pin 35T into contact with an inner surface of recess 40B (FIG. 10A and FIG. 10B, and FIG. 11 which is a cross-sectional view taken along line V-V in FIG. 10A), thereby rotating wheel 40. At this time, a rotation direction of wheel 40 is a direction opposite to that of introduction sprocket 35 (arrow R2 illustrated in FIG. 7).

As described above, in the present exemplary embodiment, wheel 40 that is a disk-shaped member is rotatably provided, and is configured to rotate in accordance with the rotation of introduction sprocket 35 as a result of bringing outer peripheral pin 35T (FIG. 10A and FIG. 10B, and FIG. 11) of rotating introduction sprocket 35 into contact with recesses 40B provided on the outer periphery of the introduction sprocket. Since introduction sprocket 35 and wheel 40 that generates a rotation force for causing cover tape peeling mechanism 25 to work are provided with conveyance path 21L provided therebetween, outer peripheral pin 35T of introduction sprocket 35 penetrates through feed hole KH of carrier tape CT to come into contact with recess 40B of wheel 40, thereby transmitting rotation force. Such an arrangement eliminates a need of a motor for causing cover tape peeling mechanism 25 to work, thereby enabling downsizing and cost saving of tape feeder 13.

In FIG. 10A, outer peripheral pin 35T of introduction sprocket 35 engaged with feed hole KH of carrier tape CT on conveyance path 21L passes through feed hole KH from below. Therefore, even in a state of being engaged with feed hole KH of carrier tape CT, outer peripheral pin 35T can enter recess 40B of wheel 40, and introduction sprocket 35 can rotate wheel 40 while conveying carrier tape CT on conveyance path 21L (FIG. 10A and FIG. 10B).

As illustrated in FIG. 10B, in an inclined surface portion of a surface of outer peripheral pin 35T of introduction sprocket 35, a portion (referred to as "contact surface 35H") in contact with an inner surface of recess 40B of wheel 40 is a flat surface. In addition, of the inner surface of recess 40B of wheel 40, a portion (referred to as "contacted surface 40H") with which contact surface 35H of introduction sprocket 35 contact is also formed of a flat surface. As described above, since contact surface 35H contacting recess 40B of outer peripheral pin 35T and contacted surface 40H with which outer peripheral pin 35T contacts out of the inner surface of recess 40B are both formed of flat surfaces, contact surface 35H and contacted surface 40H come into line contact with each other (FIG. 10B).

When outer peripheral pin 35T of introduction sprocket 35 contacts the inner surface of recess 40B, first, a distal end side of contact surface 35H of outer peripheral pin 35T comes into contact with contacted surface 40H (see contact portion TB in FIG. 12A). With progress of rotation of introduction sprocket 35, outer peripheral pin 35T and recess 40B come relatively close to each other, so that contact portion TB between outer peripheral pin 35T and the inner surface of recess 40B moves from a distal end portion of outer peripheral pin 35T to a base side (an inlet side of recess 40B) (FIG. 12A→FIG. 12B). As introduction sprocket 35 further rotates, outer peripheral pin 35T and recess 40B are relatively separated from each other, so that contact portion TB moves to the distal end side of outer peripheral pin 35T again (FIG. 12B→FIG. 12C).

In the present exemplary embodiment, since a portion (contact surface 35H) of outer peripheral pin 35T contacting recess 40B and a portion (contacted surface 40H) of the inner surface of recess 40B contacting outer peripheral pin 35T are both flat surfaces, even when contact portion TB moves (FIG. 12A→FIG. 12B→FIG. 12C), contact surface 35H of outer peripheral pin 35T and contacted surface 40H of recess 40B maintain the state of being in line contact.

Here, in a case where outer peripheral pin 35T of introduction sprocket 35 has a conventional conical shape, and the inclined surface portion contacting the inner surface of recess 40B is a curved surface, even when the inner surface of recess 40B is a flat surface, outer peripheral pin 35T comes into point contact with the inner surface of recess 40B. In the present exemplary embodiment, as described above, outer peripheral pin 35T and the inner surface of recess 40B are not in point contact but in line contact, and outer peripheral pin 35T does not locally contact the inner surface of recess 40B. Therefore, wear of outer peripheral pin 35T can be reduced, and durability of not only introduction sprocket 35 but also wheel 40 can be improved.

In FIG. 7 and FIG. 8, and part (a) and part (b) of FIG. 9, first transmission gear 41a is provided concentrically with wheel 40. A slip clutch (not illustrated) is interposed between first transmission gear 41a and wheel 40. While transmitting a torque from wheel 40 side to first transmission gear 41a, the slip clutch does not transmit a torque from first transmission gear 41a side to wheel 40. Therefore, when wheel 40 is driven by introduction sprocket 35, first transmission gear 41a rotates. However, even when first transmission gear 41a is driven by an external force (driven by manual manipulation of third peeling gear 53 to be described later), wheel 40 does not rotate.

In FIG. 7 and FIG. 8, and part (a) and part (b) of FIG. 9, second transmission gear 41b meshes with first transmission gear 41a on a downstream side of first transmission gear 41a, and third transmission gear 41c meshes with second transmission gear 41b on a downstream side of second transmission gear 41b. Therefore, when first transmission gear 41a rotates, second transmission gear 41b rotates in a direction opposite to the rotation direction of first transmission gear 41a, and third transmission gear 41c rotates in a direction opposite to the rotation direction of second transmission gear 41b (the same rotation direction as that of first transmission gear 41a).

In FIG. 8, part (a) and part (b) of FIG. 9, and FIG. 13, first peeling gear 51 is attached to third transmission gear shaft 42 which is a rotation shaft of third transmission gear 41c. Therefore, first peeling gear 51 rotates integrally with third transmission gear 41c around an axis of third transmission gear shaft 42.

In part (a) and part (b) of FIG. 9, and FIG. 13, two first peeling gears 51 are provided side by side in the direction (X direction) of third transmission gear shaft 42. These two first peeling gears 51 are integrally formed. Two second peeling gears 52 are located on a downstream side of first peeling gear 51, and provided side by side in X direction. Two third peeling gears 53 are provided side by side in X direction on third peeling gear shaft 53J located above first peeling gear 51 (part (a) and part (b) of FIG. 9).

In FIG. 7, FIG. 8, and part (a) and part (b) of FIG. 9, one of two second peeling gears 52 meshes with one of two first peeling gears 51, and the other of two second peeling gears 52 meshes with the other of two first peeling gears 51. One of two third peeling gears 53 meshes with one of two first peeling gears 51, and the other of two third peeling gears 53 meshes with the other of two first peeling gears 51. When third transmission gear 41c rotates, first peeling gear 51 rotates in the same direction as that of third transmission gear 41c, and second peeling gear 52 and third peeling gear 53 rotate in a direction opposite to the rotation direction of first peeling gear 51.

In FIG. 7, FIG. 8, and part (a) and part (b) of FIG. 9, cover tape peeling mechanism 25 further includes first guide member 61 and second guide member 62. As illustrated in FIG. 14A and FIG. 14B, first guide member 61 is made of a plate-shaped member along YZ plane, and is provided between two second peeling gears 52 arranged in X direction. An end surface located on an upstream side of first guide member 61 is guide part 61M formed of a curved guide surface. Guide part 61M is located on a downstream side of an outer peripheral surface of first peeling gear 51, and has a shape recessed toward the downstream side along an outer peripheral shape of first peeling gear 51 (part (b) of FIG. 9).

In FIG. 7, FIG. 8, part (a) and part (b) of FIG. 9, FIG. 14A and FIG. 14B, second guide member 62 has a shape like a table fork of three teeth as a whole, and includes a base part 62P corresponding to a part of the three teeth and main body part 62Q corresponding to a part of a handle. Second guide member 62 is installed in housing part 21S in an attitude in which base part 62P is directed to the downstream side and main body part 62Q is extended to the upstream side.

Base part 62P includes first locking part 62a corresponding to a center tooth of the three teeth of the table fork, and two second locking parts 62b corresponding to two teeth on both sides of the three teeth. First locking part 62a is positioned between two first peeling gears 51. Two second locking parts 62b are respectively located on both outer sides of two first peeling gears 51, and are engaged with third transmission gear shaft 42 from above (part (a) and part (b) of FIG. 9, and FIG. 14A).

When introduction sprocket 35 rotates in the tape advancing direction (arrow R1 illustrated in FIG. 5 and FIG. 7), wheel 40 rotated by introduction sprocket 35 rotates in a direction of moving recess 40B on a lower end side to the downstream side, and accordingly, first transmission gear 41a also rotates in a direction of moving lower end side teeth to the downstream side (arrow R2 illustrated in FIG. 7 and part (b) of FIG. 9). Then, by the rotation of first transmission gear 41a, second transmission gear 41b rotates in a direction of moving upper end side teeth to the downstream side, and third transmission gear 41c rotates in a direction of moving lower end side teeth to the downstream side (the same direction as that of first transmission gear 41a).

When third transmission gear 41c rotates in the direction of moving the lower end side teeth to the downstream side, first peeling gear 51 rotates integrally with third transmission gear 41c in a direction of moving lower end side teeth to the downstream side (arrow Rn illustrated in part (b) of FIG. 9). When first peeling gear 51 rotates in the direction of moving the lower end side teeth to the downstream side, second peeling gear 52 and third peeling gear 53 meshing with first peeling gear 51 rotate in a direction of moving upper end side teeth to the downstream side. Thus, the rotation directions of the three transmission gears (first transmission gear 41a, second transmission gear 41b, and third transmission gear 41c) and the three peeling gears (first peeling gear 51, second peeling gear 52, and third peeling gear 53) when introduction sprocket 35 rotates in the tape advancing direction as described above are hereinafter referred to as "feeding direction".

On the other hand, when tape feeder 13 starts conveying new carrier tape CT, introduction sprocket 35 may rotate in the tape retracting direction in order that first peeling gear 51 and second peeling gear 52 catch cover tape TT from new carrier tape CT. Wheel 40 rotated by introduction sprocket 35 rotates in a direction of moving recess 40B on the lower end side to the upstream side, and accordingly, first transmission gear 41a also rotates in a direction of moving the lower end side teeth to the upstream side (a direction opposite to arrow R2 illustrated in FIG. 7 and part (b) of FIG. 9). Then, by the rotation of first transmission gear 41a, second transmission gear 41b rotates in a direction of moving the lower end side teeth to the downstream side, and third transmission gear 41c rotates in a direction of moving upper end side teeth to the downstream side (the same rotation direction as first transmission gear 41a).

When third transmission gear 41c rotates in the direction of moving the upper end side teeth to the downstream side, first peeling gear 51 rotates integrally with third transmission gear 41c in a direction of moving upper end side teeth to the downstream side (direction opposite to arrow Rn illustrated in part (b) of FIG. 9). When first peeling gear 51 rotates in the direction of moving the upper end side teeth to the downstream side, second peeling gear 52 and third peeling gear 53 both meshing with first peeling gear 51 rotate in a direction of moving lower end side teeth to the downstream side. Thus, the rotation directions of the three transmission gears (first transmission gear 41a, second transmission gear 41b, and third transmission gear 41c) and the three peeling gears (first peeling gear 51, second peeling gear 52, and third peeling gear 53) when introduction sprocket 35 rotates in the tape retracting direction as described above are hereinafter referred to as "reverse direction".

In FIG. 6, FIG. 7, and part (b) of FIG. 9, an upper end portion of third peeling gear 53 protrudes upward from cover member 24. Operator OP can manipulate a portion of third peeling gear 53 protruding upward from cover member 24 toward the downstream side (i.e., in the feeding direction), so that third peeling gear 53 and first peeling gear 51 meshed with third peeling gear 53 can be rotated in the feeding direction.

In FIG. 6, FIG. 7, part (b) of FIG. 9, and FIG. 15, tape pressing member 64 extending in Y direction is provided at a position below cover member 24 in frame 21. Tape pressing member 64 is arranged above conveyance path 21L with a predetermined interval from conveyance path 21L. An upstream side end portion of tape pressing member 64 is located on an upstream side of first peeling gear 51 (FIG. 15).

In part (b) of FIG. 9 and FIG. 15, through hole 64H penetrating tape pressing member 64 in a thickness direction is provided at a position near the upstream side end portion of tape pressing member 64. Through hole 64H is located substantially below a contact portion (meshing portion) between first peeling gear 51 and second peeling gear 52. Carrier tape CT conveyed on conveyance path 21L in the downstream direction by introduction sprocket 35 passes under tape pressing member 64 from the upstream side end portion of tape pressing member 64 and reaches positioning sprocket 36.

In FIG. 15, air blow-out port 71 opened upward toward conveyance path 21L is provided at a position below through hole 64H provided in tape pressing member 64. Air blow-out part 73 is connected to air blow-out port 71 via air path 72 formed in frame 21. Air blow-out part 73 has a function of blowing out air from air blow-out port 71 into conveyance path 21L from below through air path 72.

In FIG. 15, manipulation piece path 81 opened to conveyance path 21L from below is provided at a position on a downstream side of air blow-out port 71 in frame 21. Manipulation piece path 81 is located below through hole 64H of tape pressing member 64. Manipulation piece 82 is housed in manipulation piece path 81, and is movable in the up-down direction in manipulation piece path 81. Manipulation piece 82 is movable between a "protruding position" where an upper end thereof protrudes into conveyance path 21L and a "non-protruding position" where the upper end thereof does not protrude into conveyance path 21L (housed in manipulation piece path 81). Manipulation piece 82 is energized toward the protruding position side by energizing spring 83.

While manipulation piece 82 is located at the protruding position in a state where carrier tape CT is not located immediately above manipulation piece path 81 (FIG. 15), the manipulation piece is pushed into manipulation piece path 81 by carrier tape CT and located at the non-protruding position in a state where carrier tape CT is located immediately above manipulation piece path 81. In FIG. 15, information on the position of manipulation piece 82 in manipulation piece path 81 is detected by manipulation piece position detector 84.

In FIG. 4, manipulation and display part 26 is provided on an upper surface of grip part 21G provided in an upper portion of frame 21 on the upstream side in a state of being exposed upward. Manipulation and display part 26 is provided with buttons and the like for operator OP to instruct controller 27 to perform necessary work, a lamp for giving various notifications to operator OP, and the like.

In FIG. 4, controller 27 is provided in frame 21. Controller 27 receives information input by operator OP from manipulation and display part 26, information indicating insertion of the head portion of carrier tape CT into tape inlet 21K, the insertion being detected by insertion detector 22a, and other information. Controller 27 controls draw-in motor 22c, drive motor 31, air blow-out part 73, and the like based on these pieces of input information.

Next, operation of tape feeder 13 will be described. For tape feeder 13 according to the present exemplary embodiment, there are prepared a "manual mode" in which operator OP manually performs initial peeling of cover tape TT from base tape BT, and an "automatic mode" in which the initial peeling is automatically performed without depending on the manual work of operator OP. Operator OP can select a desired mode from the manual mode and the automatic mode by performing predetermined manipulation through manipulation and display part 26.

First, operation of tape feeder 13 conducted when operator OP selects the manual mode will be described. Regardless of whether operator OP selects the manual mode or the automatic mode, first, in a case of loading carrier tape CT to tape feeder 13, operator OP processes the head portion of carrier tape CT drawn out from reel RL such that a head portion of cover tape TT is longer than the head portion of base tape BT by a predetermined length (e.g., about several centimeters). Thus, formed protruding portion of cover tape TT from the head portion of base tape BT is hereinafter referred to as "cover tape protruding portion TS" (FIG. 2).

After performing the processing of forming cover tape protruding portion TS at the head portion of carrier tape CT, operator OP performs manipulation of selecting the manual mode through manipulation and display part 26. Then, the head portion of carrier tape CT at which cover tape protruding portion TS is formed is inserted from tape inlet 21K (FIG. 4) of frame 21. At this time, operator OP inserts carrier tape CT into tape inlet 21K with cover tape protruding portion TS extending straight from a distal end of base tape BT.

When insertion detector 22a detects the head portion of carrier tape CT (base tape BT) being inserted into tape inlet 21K, controller 27 causes draw-in motor 22c to work. As a result, draw-in sprocket 22b rotates (arrow Ra illustrated in FIG. 4), and carrier tape CT is drawn into conveyance path 21L.

When there is no preceding carrier tape CT in conveyance path 21L, carrier tape CT drawn into conveyance path 21L is delivered to introduction sprocket 35 as it is, and when there is preceding carrier tape CT in conveyance path 21L, carrier tape CT is delivered to introduction sprocket 35 after waiting for the preceding carrier tape CT to be ejected from tape outlet 21T. When carrier tape CT is delivered from draw-in sprocket 22b to introduction sprocket 35, controller 27 stops draw-in motor 22c. As a result, draw-in sprocket 22b is brought into a free rotation state in which conveyance of carrier tape CT by introduction sprocket 35 is not hindered.

Controller 27 then stops drive motor 31 at timing when cover tape protruding portion TS of carrier tape CT conveyed in the downstream direction by introduction sprocket 35 reaches opening 24K of cover member 24. Then, the controller causes manipulation and display part 26 to turn on a predetermined lamp and to urge operator OP to perform work (setting work) of setting cover tape TT on cover tape peeling mechanism 25. After visually recognizing lighting of the lamp of manipulation and display part 26, operator OP executes the setting work.

In the setting work, operator OP first draws out cover tape protruding portion TS (i.e., cover tape TT) above cover member 24 from cover tape draw-out portion 24H (FIG. 6) provided on the upper surface of cover member 24. Cover tape draw-out portion 24H is located on an upstream side of opening 24K of cover member 24. After drawing out cover tape TT from cover tape draw-out portion 24H, operator OP moves carrier tape CT to the downstream side while pulling cover tape TT to the upstream side, so that a predetermined length of cover tape TT is peeled off from base tape BT.

In FIG. 7, FIG. 13, and FIG. 15, insertion guide 24G extending substantially horizontally toward the downstream side is provided at a position of cover member 24 above first peeling gear 51. A space below insertion guide 24G is cover tape insertion port 24E. Operator OP inserts the head portion of cover tape TT from cover tape insertion port 24E to abut the head portion of cover tape TT on a contact portion (meshing portion) between first peeling gear 51 and third peeling gear 53, and then manipulates third peeling gear 53 with a finger to rotate in the feeding direction (arrow R3 illustrated in part (b) of FIG. 9) so that a head portion of cover tape protruding portion TS is sandwiched between first peeling gear 51 and third peeling gear 53.

When the head portion of cover tape TT (cover tape protruding portion TS) is sandwiched between first peeling gear 51 and third peeling gear 53, operator OP further rotates third peeling gear 53 in the feeding direction to feed a part of cover tape TT into housing part 21S. Accordingly, when an appropriate tension is applied to cover tape TT, the setting work is finished (see FIG. 6).

In such setting work, when operator OP manipulates third peeling gear 53 in the feeding direction, first transmission gear 41a also rotates in the feeding direction via first peeling gear 51, third transmission gear 41c, and second transmission gear 41b. However, even when first transmission gear 41a rotates, wheel 40 does not rotate by action of the above-described slip clutch provided between first transmission gear 41a and the wheel (first transmission gear 41a idles with respect to wheel 40), and carrier tape CT maintains a stationary state. Thus, operator OP can apply tension to cover tape TT by manipulating third peeling gear 53 without affecting the position of carrier tape CT on conveyance path 21L.

When the setting work is finished, operator OP performs predetermined manipulation through manipulation and display part 26. When detecting the predetermined manipulation being performed through the manipulation and display part, controller 27 causes drive motor 31 to restart the working, thereby causing introduction sprocket 35 to intermittently rotate in the tape advancing direction. As a result, carrier tape CT advances on conveyance path 21L, is delivered to positioning sprocket 36, and then advances in the further downstream direction.

A pitch feeding interval of carrier tape CT corresponds to an interval of pockets PK included in carrier tape CT. Therefore, when positioning sprocket 36 pitch-feeds carrier tape CT, each pocket PK stops at component supply position 13P, and component BH in pocket PK is positioned at component supply position 13P.

When introduction sprocket 35 intermittently rotates in the tape advancing direction and carrier tape CT is pitch-fed in the downstream direction, the gears of cover tape peeling mechanism 25 rotate in accordance with the intermittent rotation of introduction sprocket 35, and the three peeling gears (first peeling gear 51, second peeling gear 52, and third peeling gear 53) intermittently rotate in the feeding direction. As a result, the head portion of cover tape TT is fed to the upstream side (inside housing part 21S), while carrier tape CT advances to the downstream side, resulting in being gradually peeled off from base tape BT.

As described above, component supply position 13P is located downstream of cover tape draw-out portion 24H, which is the position where cover tape TT is peeled off from base tape BT. Therefore, at a time point where pocket PK storing component BH reaches component supply position 13P, cover tape TT covering pocket PK is already peeled off from base tape BT, and component BH is exposed upward. Mounting head 14 therefore can suck and take out component BH exposed from pocket PK at component supply position 13P by nozzle 14N.

Carrier tape CT (base tape BT) after pocket PK passes through component supply position 13P is delivered from positioning sprocket 36 to ejection sprocket 38. Carrier tape CT delivered to ejection sprocket 38 is further conveyed in the downstream direction by ejection sprocket 38 to be ejected from tape outlet 21T to an outside of cover member 24 (i.e., an outside of tape feeder 13) (FIG. 4). Since ejection sprocket 38 is provided near tape outlet 21T, it is possible to reliably eject, from tape outlet 21T, carrier tape CT just before component shortage, and even carrier tape CT having a rear portion separated from engagement with the pins of positioning sprocket 36.

First peeling gear 51 and third peeling gear 53 rotate in the feeding direction in conjunction with the rotation operation of introduction sprocket 35 in the tape advancing direction. Therefore, cover tape TT peeled off from base tape BT and sandwiched between first peeling gear 51 and third peeling gear 53 is fed (ejected) into housing part 21S as carrier tape CT is conveyed in the downstream direction. Cover tape TT fed into housing part 21S is then collected by operator OP.

As described above, in tape feeder 13 according to the present exemplary embodiment, introduction sprocket 35, positioning sprocket 36, ejection sprocket 38, first peeling gear 51, and third peeling gear 53 are driven upon reception of rotational power of drive motor 31, and conveyance operation of carrier tape CT and feeding operation of cover tape TT to housing part 21S can be performed by one power source (drive motor 31).

Next, operation of tape feeder 13 conducted when operator OP selects the automatic mode will be described. After selecting the automatic mode through manipulation and display part 26, operator OP inserts, into tape inlet 21K of frame 21, the head portion of carrier tape CT on which cover tape protruding portion TS is formed.

When insertion detector 22a detects the head portion of carrier tape CT (base tape BT) being inserted into tape inlet 21K, controller 27 causes draw-in motor 22c to work. As a result, draw-in sprocket 22b rotates (arrow Ra illustrated in FIG. 4), and carrier tape CT is drawn into conveyance path 21L. Similarly to the case where the manual mode is set, when there is no preceding carrier tape CT in conveyance path 21L, carrier tape CT drawn into conveyance path 21L is delivered to introduction sprocket 35 as it is, and when there is preceding carrier tape CT in conveyance path 21L, carrier tape CT is delivered to introduction sprocket 35 after waiting for preceding carrier tape CT to be ejected from tape outlet 21T. Then, similarly to the case where the manual mode is set, when carrier tape CT is delivered from draw-in sprocket 22b to introduction sprocket 35, controller 27 stops draw-in motor 22c to bring draw-in sprocket 22b into the free rotation state.

When the head portion of carrier tape CT (base tape BT) conveyed by introduction sprocket 35 in the downstream direction reaches above manipulation piece 82, manipulation piece 82 energized by energizing spring 83 and positioned at the protruding position is pushed down by carrier tape CT and displaced to the non-protruding position (FIG. 16A, arrow Y1 illustrated in the figure). In a case where the automatic mode is set, when manipulation piece position detector 84 detects manipulation piece 82 being displaced from the protruding position to the non-protruding position, controller 27 switches operation direction of drive motor 31.

Introduction sprocket 35 rotating in the tape advancing direction temporarily stops due to switching of the operation direction of drive motor 31 and then rotates in the tape retracting direction (arrow RR illustrated in FIG. 16B). As a result, carrier tape CT is conveyed toward the upstream side, and the three peeling gears (first peeling gear 51, second peeling gear 52, and third peeling gear 53) rotate in reverse directions (arrow Rr illustrated in FIG. 16B).

When the head portion of carrier tape CT (base tape BT) is positioned on an upstream side of manipulation piece 82 as carrier tape CT is conveyed toward the upstream side, manipulation piece 82 is not pushed downward by carrier tape CT, and thus returns to the protruding position by an energizing force of energizing spring 83 (arrow Y2 illustrated in FIG. 16B). When manipulation piece position detector 84 detects manipulation piece 82 being returned to the protruding position, controller 27 switches the operation direction of drive motor 31 again at timing when the head portion of cover tape protruding portion TS is located upstream of air blow-out port 71 (FIG. 16B).

When the operation direction of drive motor 31 is switched, introduction sprocket 35 rotating in the tape retracting direction temporarily stops and then rotates in the tape advancing direction (arrow R1 illustrated in FIG. 17A), and carrier tape CT is conveyed again toward the down-stream direction. When introduction sprocket 35 rotates in the tape advancing direction, each of first peeling gear 51, second peeling gear 52, and third peeling gear 53 rotates in the feeding direction (arrow Rn illustrated in FIG. 17A).

After switching the operation direction of drive motor 31, controller 27 causes air blow-out part 73 to work and causes air Air to blow out from air blow-out port 71 into conveyance path 21L for a fixed period of time (FIG. 17A). As a result, when passing above air blow-out port 71, cover tape protruding portion TS of carrier tape CT to be conveyed in the downstream direction is blown up by the air blown out from air blow-out port 71. Then, cover tape protruding portion TS passes through through hole 64H of tape pressing member 64 to move upward of tape pressing member 64 (FIG. 17A).

When carrier tape CT with cover tape protruding portion TS moved upward of tape pressing member 64 is conveyed in the downstream direction, the distal end portion of cover tape protruding portion TS approaches, from below, the contact portion (meshing portion) between first peeling gear 51 and second peeling gear 52 rotating in the feeding direction. Then, upon arrival of the distal end portion of cover tape protruding portion TS at the contact portion (meshing portion) between first peeling gear 51 and second peeling gear 52, cover tape protruding portion TS is sandwiched between first peeling gear 51 and second peeling gear 52 (FIG. 17B).

As described above, when first peeling gear 51 and second peeling gear 52 rotate in the feeding direction with cover tape protruding portion TS sandwiched between first peeling gear 51 and second peeling gear 52 (carrier tape CT is conveyed in the downstream direction), cover tape TT is peeled off from base tape BT. Then, a state continues in which cover tape TT is peeled off from base tape BT as introduction sprocket 35 rotates in the tape advancing direction.

In consideration of a case where one blowing of air Air from air blow-out port 71 does not cause cover tape protruding portion TS to move upward of tape pressing member 64 through through hole 64H, advancing operation and retreating operation of carrier tape CT may be repeated several times in such a manner as FIG. 18A→FIG. 17B-FIG. 18A before the processing proceeds from FIG. 18A to FIG. 18B.

Cover tape TT peeled off from base tape BT is fed upward while being sandwiched between first peeling gear 51 and second peeling gear 52 that rotate in the feeding direction. At this time, cover tape TT is guided by guide part 61M of first guide member 61 to advance in a curved route along an outer periphery of first peeling gear 51 toward a direction of the contact portion between first peeling gear 51 and third peeling gear 53.

Specifically, in the present exemplary embodiment, guide part 61M of first guide member 61 is configured to guide cover tape TT to move along the outer periphery of first peeling gear 51 in the curved route toward the contact portion between first peeling gear 51 and third peeling gear 53, cover tape TT being peeled off from base tape BT by first peeling gear 51 and second peeling gear 52.

As described above, in the present exemplary embodiment, first peeling gear 51 as a first rotation body and second peeling gear 52 as a second rotation body that rotate in contact with each other serve as peeling parts that feed cover tape TT sandwiched therebetween to peel cover tape TT from base tape BT. In addition, in the present exemplary embodiment, first guide member 61 is configured to guide cover tape TT so as to move along the outer periphery of first peeling gear 51 toward the part between first peeling gear 51 and third peeling gear 53 (the contact portion between first peeling gear 51 and third peeling gear 53), cover tape TT being peeled off from base tape BT by first peeling gear 51 and second peeling gear 52.

At start of conveying new carrier tape CT by tape feeder 13, when new carrier tape CT is conveyed in the upstream direction in order that first peeling gear 51 and second peeling gear 52 catch cover tape TT from carrier tape CT, first peeling gear 51 and third peeling gear 53 rotate in the reverse directions. As a result, although a rear portion of cover tape TT is returned in a direction opposite to an ejection direction, at this time, the rear portion of cover tape TT moves in a route different from the curved route guided by first guide member 61. Specifically, the rear portion of cover tape TT is conveyed along an upper surface of first guide member 61 by first guide member 61 and ejected from cover tape insertion port 24E of cover member 24.

Cover tape TT (cover tape protruding portion TS) peeled off from base tape BT by first peeling gear 51 and second peeling gear 52 reaches the contact portion between first peeling gear 51 and third peeling gear 53 as a result of being guided by first guide member 61 so as to move along the outer periphery of first peeling gear 51. Then, after being sandwiched between first peeling gear 51 and third peeling gear 53 that rotate in the feeding direction along with the rotation of introduction sprocket 35 (FIG. 18A), the head portion of cover tape TT having reached the contact portion between first peeling gear 51 and third peeling gear 53 is fed to housing part 21S and ejected into housing part 21S (FIG. 18B).

As described above, in the present exemplary embodiment, first peeling gear 51 and third peeling gear 53 as a third rotation body which rotate in a contact state serve as ejection parts which eject cover tape TT peeled off from base tape BT by first peeling gear 51 and second peeling gear 52 by sandwiching and feeding cover tape TT.

Here, as described above, first locking part 62a of second guide member 62 is positioned between two first peeling gears 51, and first guide member 61 is positioned between two second peeling gears 52. Further, as illustrated in FIG. 15, plate-shaped part 24R attached to third peeling gear shaft 53J which is a rotation shaft of third peeling gear 53 (or provided as a part of cover member 24) is located between lower regions of two third peeling gears 53. Therefore, it is possible to prevent occurrence of an operation trouble of tape feeder 13 caused by winding of cover tape TT (including cover tape protruding portion TS), which can be easily deformed due to its small thickness, around the two gears arranged in the X direction, or caused by cover tape TT entering between the two gears or getting entangled.

As described above, in the present exemplary embodiment, first locking part 62a of second guide member 62 is located between two first peeling gears 51 to serve as a first winding prevention part that prevents cover tape TT from winding around two first peeling gears 51. First guide member 61 is located between two second peeling gears 52 and serves as a second winding prevention part that prevents cover tape TT from winding around two second peeling gears 52. Plate-shaped part 24R is located between two third peeling gears 53 and serves as a third winding prevention part that prevents cover tape TT from winding around two third peeling gears 53.

Here, it is assumed that immediately after a rear portion of carrier tape CT getting near to component shortage passes through through hole 64H, a head portion of subsequent carrier tape CT is inserted into tape inlet 21K. In this case, there may occur a situation where in a state where the rear portion of cover tape TT being peeled off from preceding carrier tape CT and completely separated from base tape BT thereof has not yet passed through the contact portion between first peeling gear 51 and third peeling gear 53, manipulation piece 82 is pushed down by the head portion of subsequent carrier tape CT that has advanced in the downstream direction (FIG. 19A).

In such a situation, immediately after that, introduction sprocket 35 is rotated in the tape retracting direction (arrow RR illustrated in FIG. 19B), so that the three peeling gears (first peeling gear 51, second peeling gear 52, and third peeling gear 53) rotate in the reverse directions (arrow Rr illustrated in FIG. 19B). As a result, first peeling gear 51 and third peeling gear 53 return cover tape TT being sandwiched with the rear portion thereof as a head to a direction opposite to the ejection direction (direction toward housing part 21S).

However, when cover tape TT is returned by first peeling gear 51 and third peeling gear 53, unlike time of peeling off cover tape TT, cover tape TT is not guided by such a curved guide surface as guide part 61M, and thus cover tape TT advance substantially straight along a tangential direction of first peeling gear 51 and third peeling gear 53. For this reason, the rear portion of cover tape TT returned from first peeling gear 51 and third peeling gear 53 does not return along the route through which the cover tape is fed by first peeling gear 51 and second peeling gear 52, but advances in a direction (specifically, as illustrated in FIG. 19B, a direction passing above first guide member 61 toward cover tape insertion port 24E) different from a direction toward guide part 61M from between third peeling gear 53 and guide part 61M.

Specifically, in the present exemplary embodiment, guide part 61M is provided that guides cover tape TT separated from base tape BT by first peeling gear 51 and second peeling gear 52 so as to advance in the route toward the contact portion between first peeling gear 51 and third peeling gear 53, and in a case where after the rear portion of cover tape TT received by first peeling gear 51 and third peeling gear 53 from first peeling gear 51 and second peeling gear 52 passes through guide part 61M, cover tape TT is fed back, the rear portion of cover tape TT advances in the direction different from the direction toward guide part 61M from between third peeling gear 53 and guide part 61M. Therefore, even in a case where peeled off cover tape TT is returned in the direction opposite to the direction at the time of peeling-off because subsequent carrier tape CT is loaded following preceding carrier tape CT, cover tape TT does not return to guide part 61M, and thus does not flow back to conveyance path 21L of carrier tape CT. Therefore, it is possible to prevent cover tape TT of preceding carrier tape CT from interfering with peeling of cover tape TT of subsequent carrier tape CT.

As described above, in tape feeder 13 according to the present exemplary embodiment, outer peripheral pin 35T of introduction sprocket 35 that conveys carrier tape CT is brought into contact with recess 40B provided on the outer periphery of wheel 40, so that the wheel rotates in accordance with the rotation of the introduction sprocket 35. Since contact surface 35H of outer peripheral pin 35T contacting the inner surface of recess 40B, and contacted surface 40H with which outer peripheral pin 35T contacts out of the inner surface of recess 40B are both formed of flat surfaces, and contact surface 35H and contacted surface 40H come into line contact with each other, outer peripheral pin 35T does not come into point contact (do not locally abut) with the inner surface of recess 40B unlike a case where outer peripheral pin 35T has a conical shape. Therefore, wear of outer peripheral pin 35T can be reduced, and durability of not only introduction sprocket 35 but also wheel 40 can be improved.

Although the exemplary embodiment of the present disclosure has been described in the foregoing, the present disclosure is not limited to the above exemplary embodiment, and various modifications and the like can be made. For example, the configuration of conveyance mechanism 23 described in the above exemplary embodiment is an example, and other configurations may be provided as long as carrier tape CT on conveyance path 21L can be conveyed.

Further, each of the three peeling gears (first peeling gear 51, second peeling gear 52, and third peeling gear 53) constituting the peeling part and the ejection part of cover tape peeling mechanism 25 may be changed to another rotation body such as a roller member. In other words, the peeling part only needs to include the first rotation body and the second rotation body that rotate in the contact state, and the ejection part only needs to include the first rotation body and the third rotation body that rotate in the contact state.

The present disclosure is applicable to a component supply device that conveys a component supply tape storing a component and supplies the component to a component supply position.

What is claimed is:

1. A component supply device that supplies a component to a component supply position using a component supply tape including a base tape and a cover tape, the base tape having a storage part storing the component, the cover tape being attached to the base tape to cover the storage part, the component supply device comprising:
    a frame including a conveyance path for the component supply tape;
    a sprocket that is provided in the frame, includes a pin, and rotates with the pin engaged with a feed hole of the component supply tape on the conveyance path to convey the component supply tape; and
    a disk-shaped member that rotates in accordance with rotation of the sprocket, wherein
        the disk-shaped member includes a recess that is provided on an outer periphery of the disk-shaped member, and
        the pin of the rotating sprocket passes through the feed hole of the component supply tape and comes into contact with the recess of the disk-shaped member to rotate the disk-shaped member.

2. The component supply device according to claim 1, wherein a contact surface of the pin contacting an inner surface of the recess and a contacted surface with which the pin contacts out of the inner surface of the recess are both flat surfaces, and the contact surface and the contacted surface come into line contact with each other.

3. The component supply device according to claim 1, further comprising:
    a transmission gear driven by the disk-shaped member; and
    a cover tape peeling mechanism driven through the transmission gear to peel the cover tape from the base tape.

4. The component supply device according to claim 3, wherein the cover tape peeling mechanism includes
    a peeling part that includes a first rotation body and a second rotation body that rotate in a contact state, and sandwiches and feeds a cover tape to peel the cover tape from a base tape,
    an ejection part that includes the first rotation body and a third rotation body that rotate in a contact state, and sandwiches and feeds a cover tape fed from the peeling part to eject the cover tape, and
    a guide part that guides a cover tape peeled from a base tape by the peeling part to advance in a route toward a contact portion between the first rotation body and the third rotation body.

5. The component supply device according to claim 4, wherein in a case where after a rear portion of a cover tape received by the ejection part from the peeling part passes through the guide part, the ejection part feeds back the cover tape, the guide part guides the rear portion of the cover tape toward a direction different from the route.

6. The component supply device according to claim 4, wherein each of the first rotation body, the second rotation body, and the third rotation body includes a gear.

7. The component supply device according to claim 2, further comprising a housing part that houses a cover tape ejected by the cover tape peeling mechanism.

8. The component supply device according to claim 3, wherein the transmission gear is provided concentrically with the disk-shaped member.

9. The component supply device according to claim 8, wherein a slip clutch is interposed between the transmission gear and the disk-shaped member.

10. The component supply device according to claim 4, wherein the first rotation body rotates integrally with the transmission gear around an axis of a shaft of the transmission gear.

* * * * *